US008140279B2

(12) United States Patent
Subbloie

(10) Patent No.: US 8,140,279 B2
(45) Date of Patent: Mar. 20, 2012

(54) COMPUTER BASED ENERGY MANAGEMENT

(75) Inventor: Albert Subbloie, Milford, CT (US)

(73) Assignee: Budderfly Ventures, LLC, Milford, CT (US)

( * ) Notice: Subject to any disclaimer, the term of this patent is extended or adjusted under 35 U.S.C. 154(b) by 684 days.

(21) Appl. No.: 12/235,771

(22) Filed: Sep. 23, 2008

(65) Prior Publication Data

US 2009/0083167 A1 Mar. 26, 2009

Related U.S. Application Data

(60) Provisional application No. 61/047,976, filed on Apr. 25, 2008, provisional application No. 61/020,044, filed on Jan. 9, 2008, provisional application No. 60/974,565, filed on Sep. 24, 2007.

(51) Int. Cl.
*G06F 19/00* (2006.01)
*G01R 11/56* (2006.01)

(52) U.S. Cl. ........... 702/61; 700/296; 705/412; 709/224

(58) Field of Classification Search .................. 700/276, 700/286, 295, 10, 296; 702/60, 61, 62, 64; 713/300, 320; 709/219, 214; 711/165, 170, 711/173; 705/30, 34, 400, 412
See application file for complete search history.

(56) References Cited

U.S. PATENT DOCUMENTS 4,253,151 A 2/1981 Bouve
4,264,960 A 4/1981 Gurr
4,332,980 A * 6/1982 Reynolds et al. ............. 370/259
4,513,382 A 4/1985 Faulkner, Jr.
4,686,630 A 8/1987 Marsland et al.
4,855,922 A * 8/1989 Huddleston et al. .......... 700/295
5,436,510 A 7/1995 Gilbert
5,682,949 A * 11/1997 Ratcliffe et al. .............. 165/209
5,930,773 A * 7/1999 Crooks et al. ................... 705/30
6,088,688 A * 7/2000 Crooks et al. ................. 705/412
6,301,674 B1 10/2001 Saito et al.
6,327,541 B1 * 12/2001 Pitchford et al. ............... 702/62
6,553,418 B1 * 4/2003 Collins et al. ................. 709/224
(Continued)

FOREIGN PATENT DOCUMENTS

JP 2005032235 A 2/2005
(Continued)

OTHER PUBLICATIONS

PCT/US2008/077423 Mailed Apr. 28, 2009. pp. 11.

*Primary Examiner* — Andrew Joseph Rudy
(74) *Attorney, Agent, or Firm* — Cantor Colburn LLP

(57) ABSTRACT

Computer based energy management including an adaptor having a server network interface and a control device interface. The server network interface receives commands from the energy management host software, the commands specify a control device and include control instructions and requests for energy usage data. The control device interface transmits the commands to the control device and receives energy usage data from the control device. The server network interface transmits the energy usage data to the energy management software in response to receiving the energy usage data from the control device. In this manner, the adaptor provides a bridge between the server network and the copper wire network to provide control and measurement of energy usage at a control device level in response to commands from a remote computer system.

22 Claims, 14 Drawing Sheets

U.S. PATENT DOCUMENTS

| | | | | |
|---|---|---|---|---|
| 6,618,709 | B1 * | 9/2003 | Sneeringer | 705/412 |
| 6,631,309 | B2 | 10/2003 | Boies et al. | |
| 6,633,781 | B1 | 10/2003 | Lee et al. | |
| 6,671,586 | B2 | 12/2003 | Davis et al. | |
| 6,842,706 | B1 | 1/2005 | Baraty | |
| 6,862,498 | B2 | 3/2005 | Davis et al. | |
| 6,912,664 | B2 * | 6/2005 | Ranganathan et al. | 713/320 |
| 6,993,417 | B2 | 1/2006 | Osann, Jr. | |
| 7,010,363 | B2 | 3/2006 | Donnelly et al. | |
| 7,049,976 | B2 | 5/2006 | Hunt et al. | |
| 7,080,267 | B2 * | 7/2006 | Gary et al. | 713/300 |
| 7,088,238 | B2 | 8/2006 | Karaoguz et al. | |
| 7,110,832 | B2 | 9/2006 | Ghent | |
| 7,123,994 | B2 * | 10/2006 | Weik et al. | 700/295 |
| 7,135,956 | B2 * | 11/2006 | Bartone et al. | 340/3.9 |
| 7,149,605 | B2 | 12/2006 | Chassin et al. | |
| 7,181,293 | B2 | 2/2007 | Rothman et al. | |
| 7,216,108 | B2 | 5/2007 | Hastings et al. | |
| 7,274,975 | B2 | 9/2007 | Miller | |
| 7,353,121 | B2 | 4/2008 | Baraty | |
| 7,379,997 | B2 | 5/2008 | Ehlers et al. | |
| 7,409,303 | B2 * | 8/2008 | Yeo et al. | 702/60 |
| 7,474,080 | B2 * | 1/2009 | Huff et al. | 322/24 |
| 7,778,734 | B2 * | 8/2010 | Oswald et al. | 700/276 |
| 7,873,441 | B2 * | 1/2011 | Synesiou et al. | 700/286 |
| 7,930,118 | B2 * | 4/2011 | Vinden et al. | 702/64 |
| 2003/0055677 | A1 | 3/2003 | Brown et al. | |
| 2003/0225483 | A1 | 12/2003 | Santinato et al. | |
| 2003/0233201 | A1 | 12/2003 | Horst et al. | |
| 2004/0254683 | A1 | 12/2004 | Kim | |
| 2005/0033701 | A1 | 2/2005 | Challener et al. | |
| 2005/0033707 | A1 | 2/2005 | Ehlers et al. | |
| 2005/0086182 | A1 | 4/2005 | Nagy et al. | |
| 2006/0095164 | A1 | 5/2006 | Donnelly et al. | |
| 2006/0106741 | A1 | 5/2006 | Janarthanan | |
| 2006/0129497 | A1 | 6/2006 | Baraty | |
| 2006/0129498 | A1 | 6/2006 | Baraty | |
| 2006/0149691 | A1 | 7/2006 | Sindambiwe | |
| 2006/0155423 | A1 | 7/2006 | Budike, Jr. | |
| 2007/0260359 | A1 | 11/2007 | Benson et al. | |
| 2007/0276547 | A1 | 11/2007 | Miller | |
| 2008/0046388 | A1 | 2/2008 | Budike, Jr. | |
| 2008/0310350 | A1 | 12/2008 | Dykema et al. | |
| 2009/0299527 | A1 | 12/2009 | Huizenga et al. | |
| 2009/0315668 | A1 | 12/2009 | Leete, III et al. | |
| 2010/0114340 | A1 | 5/2010 | Huizenga et al. | |
| 2010/0134051 | A1 | 6/2010 | Huizenga et al. | |
| 2010/0185339 | A1 | 7/2010 | Huizenga et al. | |

FOREIGN PATENT DOCUMENTS

| | | | |
|---|---|---|---|
| KR | 1020060004031 | A | 12/2006 |
| WO | 0241585 | A2 | 5/2002 |
| WO | 2006049356 | A1 | 5/2006 |

* cited by examiner

BILLING DETAIL REPORT

CUSTOMER NAME
CUSTOMER NUMBER
TOTAL CHARGES - $, USAGE

- FLORIDA PLANT - $, USAGE
  - PRODUCTION BUILDING - $, USAGE
  - PURCHASING BUILDING - $, USAGE
    - FIRST FLOOR - $, USAGE
    - SECOND FLOOR - $, USAGE
      - OFFICE 1 - $, USAGE
      - OFFICE 2 - $, USAGE
        - DESK LAMP - $, USAGE
        - OVERHEAD LIGHT - $, USAGE
        - COMPUTER - $, USAGE
      - OFFICE 3 - $, USAGE

FIG. 8

COMPUTER BASED ENERGY MANAGEMENT

CROSS-REFERENCE TO RELATED APPLICATIONS

The present application claims the benefit of provisional application No. 61/020,044 filed Jan. 9, 2008, the content of which is hereby incorporated by reference in its entirety. The present application also claims the benefit of provisional application No. 60/974,565 filed Sep. 24, 2007, the content of which is hereby incorporated by reference in its entirety. The present application further claims the benefit of provisional application No. 61/047,976 filed Apr. 25, 2008, the content of which is hereby incorporated by reference in its entirety.

BACKGROUND

Exemplary embodiments relate generally to energy management, and more particularly, to computer based energy management.

Energy utilization has recently become a more recognized global problem due to limited supply resulting in higher costs and increasing consumption in almost every country around the world. Most current traditional energy sources are limited and therefore energy is considered a scarce resource. With demand increasing dramatically, the result will continue to be lower supply and climbing costs.

The current methods and systems that have evolved and are used for managing all types of energy are obsolete and not very efficient from several vantage points. There are at least two noteworthy inefficiencies in the current infrastructure used for energy management, control, billing and usage. First, is the basic fact that utility companies throughout the world that supply a variety of energy types, including but not limited to electricity, gas, and water, decided long ago to group all energy devices by facility or building structure and to use a method called metering to measure the usage of that building for the major purpose of billing the customer for their periodic usage. Metering is the primary method used throughout the world, and many inventions have been created to assist the utility companies in more efficiently managing this existing metering model or concept. The second major limitation in the current system is the manner in which construction companies/builders/designers have designed and constructed each facility or building by enabling a switching or control model based on pre-established control devices (e.g., switches) that are limited through pre-wiring to a group of energy devices, and typically require manual control by a person entering or leaving a room or area that was pre-wired to operate via that control device.

In the first problem described above, the limited method of metering does not allow the measurement or usage to be reported and monitored at the device level, and instead only allows reporting or billing at the facility or building level. This greatly limits or even prevents enough visibility to the actual usage itself, which is at the energy device level, thereby causing greater inefficiency through lack of visibility into the lowest common denominator of usage. The second problem described above exacerbates this challenge further by not allowing tighter control and management over the actual energy devices (e.g., lights and heating devices), and offers at best a method of control that relies on a physically random method of management mostly through uninterested parties walking around and who may happen to manage the utilization as a matter of convenience. For example, rooms often remain fully lit with no one using them, or the temperature of a room is relatively high with no occupants to require the energy consumption.

Energy (inclusive of electricity, gas, oil and other forms of enterprise and residential power) has historically been considered a commodity. While energy costs have increased dramatically over the past decade, the degree of innovation in the area of energy management has primarily been low tech. It would be desirable to utilize the advances in computer and networking technology to provide improved energy management in order to optimize usage and drive down the costs of energy in the commercial, government, and residential markets.

BRIEF SUMMARY OF THE INVENTION

An exemplary embodiment includes an adaptor for providing computer based energy management. The adaptor includes a server network interface and a control device interface. The server network interface is in communication with energy management host software via a server network. The server network interface receives commands from the energy management host software, the commands specifying a control device and including control instructions and requests for energy usage data. The control device interface is in communication with the specified control device. The control device interface transmits the commands to the control device and receives energy usage data from the control device in response to a command including a request for energy usage data. The energy usage data includes energy usage for one or more energy devices in communication with the control device via a copper wire network. The server network interface transmits the energy usage data to the energy management software in response to receiving the energy usage data from the control device. In this manner, the adaptor provides a bridge between the server network and the copper wire network to provide control and measurement of energy usage at a control device level in response to commands from a remote computer system.

Another exemplary embodiment includes an adaptor for providing computer based energy management. The adaptor includes a server network interface and an energy device interface. The server network interface is in communication with energy management host software via a server network. The server network interface receives commands from the energy management host software. The commands specify an energy device and include control instructions and requests for energy usage data. The energy device interface is in communication with the specified energy device via a copper wire network. The energy device interface transmits the commands to the energy device and receives energy usage data from the energy device in response to a command including a request for energy usage data. The server network interface transmits the energy usage data to the energy management software in response to receiving the energy usage data from the control device. In this manner, the adaptor provides a bridge between the server network and the copper wire network to provide control and measurement of energy usage at a energy device level in response to commands from a remote system.

Another exemplary embodiment includes a method for providing computer based energy management. The method includes receiving commands specifying a control device from energy management host software located on a host system. The commands are received at an adaptor via a server network, and include control instructions and requests for energy usage data. The commands are transmitted to the control device via a control device interface on the adaptor. Energy usage data is received from the control device in response to a command including a request for energy usage. The energy usage data includes energy usage for one or more energy devices in communication with the control device via a copper wire network. The energy usage data is transmitted to the energy management software in response to receiving the energy usage data from the control device. In this manner, a bridge is provided between the server network and the copper wire network to facilitate control and measurement of energy usage at a control device level in response to commands received from the energy management host software.

A further exemplary embodiment includes a method for providing computer based energy management. The method includes receiving commands specifying an energy device from energy management host software located on a host system. The commands are received at an adaptor via a server network, and include control instructions and requests for energy usage data. The commands are transmitted to the energy device via an energy device interface on the adaptor. The energy device interface is in communication with the energy device via a copper wire network. Energy usage data is received from the energy device in response to a command including a request for energy usage. The energy usage data includes energy usage for the energy device. The energy usage data is transmitted to the energy management software in response to receiving the energy usage data from the control device, In this manner a bridge is provided between the server network and the copper wire network to provide control and measurement of energy usage at a energy device in response to commands received from the energy management host software.

A further exemplary embodiment includes an adaptor for providing computer based energy management. The adaptor includes a server network interface and a device interface. The server network interface is in communication with energy management host software via a server network. The server network interface receives commands from the energy management host software. The commands specify a control device or an energy device and include requests for energy usage data. The device interface is in communication with the specified device and transmits the commands to the specified device and receives energy usage data from the specified device in response to the commands. The energy usage data includes energy usage for the device if the device is an energy device. The energy device is in communication with the device interface via a copper wire network. The energy usage data includes energy usage for one or more energy devices in communication with the specified device via a copper wire network if the specified device is a control device. The server network interface transmits the energy usage data to the energy management software in response to receiving the energy usage data from the specified device. In this manner, the adaptor provides a bridge between the server network and the copper wire network to provide control and measurement of energy usage at a device level in response to commands from a remote computer system.

A further exemplary embodiment includes a method for providing computer based energy management. The method includes receiving a request for billing data for a group of one or more devices for a specified date range. Energy usage data in the date range is requested for the one or more devices. The energy usage data is sourced from one or more adaptors in communication with the one or more devices. The requesting is to the adaptors via a server network. The energy usage data is received from the one or more adaptors via the server network. It is determined if the energy usage data includes actual usage for each device in the group. Actual usage data is estimated for a device in the group in response to determining that the energy usage data does not include actual usage for the device. A cost is assigned to each of the devices in the group. The cost is responsive to the actual energy usage data for each device. The billing data is transmitted to the requester. The billing data includes a device identifier, the actual usage data, the assigned cost for each of the devices in the group, an actual usage total for the group, an assigned cost total for the group, and the date range, thereby providing billing visibility to the device level.

BRIEF DESCRIPTION OF THE DRAWINGS

Referring now to the drawings wherein like elements are numbered alike in the several FIGURES:

FIG. 8 depicts a billing detail report that may be implemented by exemplary embodiments;

DETAILED DESCRIPTION

Figure 1:
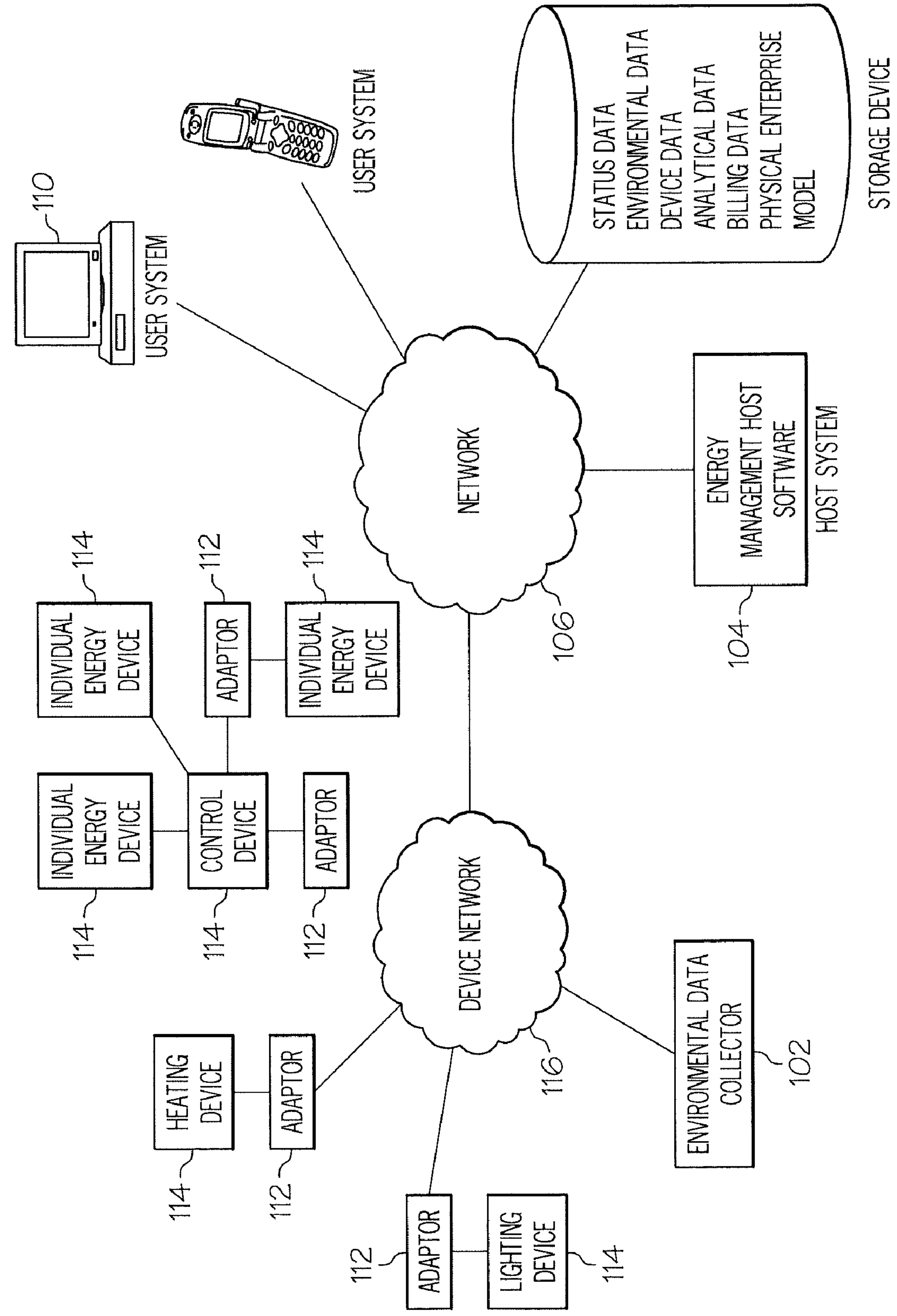
FIG. 1 depicts a block diagram of a system for on-demand energy that may be implemented by exemplary embodiments.

Exemplary embodiments of the present invention include an innovation in the energy management marketplace that will change the way energy is used, distributed, billed, and conserved in the commercial, government, and residential markets. Exemplary embodiments relate generally to energy management, and more specifically to the manner in which energy devices are controlled, metered and/or measured, for the purpose of understanding energy usage for an individual energy device or group of energy devices. Data generated by exemplary embodiments can also be used for billing at a more detailed level or simply for better reporting on energy usage by any combination of specific device or groups of devices.

As used herein, the term "energy device" refers to an item that consumes energy, such as, but not limited to: a lighting device, a heating/air conditioning device, an appliance, an electronic device, an electrical outlet or plug, or even a street light, stop light, or lights on sports fields or parking lots. As used herein, the term "control device" refers to an item that controls the switching of an energy device or group of energy devices, such as, but not limited to: a switch, and a thermostat control mechanism. As used herein, the term "device" refers to an energy device or a control device. As used herein, the terms "copper wire" and "power line" are synonymous and are used interchangeably.

Exemplary embodiments move and automate the switching/control function and the usage measurement function down to the control device and/or down to the energy device level by utilizing newer available computer circuit chip technology. In addition, all connected control and energy devices are integrated by specialized application software operating on a centralized server that can manage, measure, monitor, bill, and report all the way down to the control and/or energy device level. Based on electronic integration to all connected devices, this specialized server based application software allows real time (or near real time) flexible reporting, granular billing by device, and efficient management of energy at any level of detail (i.e. room, person, floor, bank of lights, one energy device, etc.), to allow the most effective management, control, and measurement possible.

Exemplary embodiments utilize "adaptors" attached to any or all specific devices (e.g. energy devices and control devices). The adaptor provides the ability to measure usage by device, or even group of devices if it is placed at the control device level. In addition, the adaptor provides the ability to control and manage a device or group of devices. Control and/or usage measurement is supported by the adaptor. The adaptor enables all connected devices to be networked using a wireless network, or over the electrical copper wire itself to a computer server that operates specialized application software designed for energy management, control and measurement/reporting. This new network of devices is referred to herein as the "On Premise Energy Network" (OPEN network). These strategically-placed device adaptors enable a network of energy devices resulting in more efficient control, and measurement through the newly created OPEN network. Exemplary embodiments are described in more detail below.

FIG. 1 depicts a block diagram of a system for providing on-demand energy management, including component based utility bill management that may be implemented by exemplary embodiments of the present invention. The system depicted in FIG. 1 and described herein is referred to as the "OPEN network." The system in FIG. 1 includes a device network 116 (e.g., made up of existing copper wires) for providing communication between the devices 114 and the energy management host software described herein. In addition, the system in FIG. 1 includes a server network 106 (e.g., a wireless network) for communication with the device network 116, host system 104, storage device 108 and user system(s) 110. The user systems 110 depicted in FIG. 1 may be implemented by any device capable of communicating with the server network 106 such as, but not limited to: a personal computer, a personal digital assistant, and/or a cellular telephone. In an exemplary embodiment, a user system 110 is utilized to communicate with the component based utility bill management software portion of the energy management host software on the host system 104 to generate billing reports. A user may access a user system 110 by logging on to a web site that hosts the energy management host software. In an exemplary embodiment, a local server on premise is plugged in to the existing copper network for providing a link to the wireless network, access to the Internet network outside of the premises, and access to the device network.

The host system 104 includes energy management host software that directs the energy management and control functions described herein, including the component based utility bill management. The host system 104 depicted in FIG. 1 may be implemented using one or more servers operating in response to a computer program stored in a storage medium accessible by the server. The host system 104 may operate as a network server (e.g., a web server) to communicate with the user systems 110, and the adaptors 112 (e.g., via the device network 116). The host system 104 handles sending and receiving information to and from the user systems 110 and the adaptors 112, and can perform associated tasks. The host system 104 may also include a firewall to prevent unauthorized access to the host system 104 and enforce any limitations on authorized access. A firewall may be implemented using conventional hardware and/or software as is known in the art.

The host system 104 may also operate as an application server. The host system 104 executes one or more computer programs (referred to herein collectively as the energy management host software) to implement the computer based on-demand energy management functions, described herein. Processing may be shared by one or more of the user systems 110 and host system 104 by providing an application (e.g., java applet) to the user systems 110. Alternatively, a user system 110 can include a stand-alone software application for performing a portion or all of the processing described herein. As previously described, it is understood that separate servers may be utilized to implement the network server functions and the application server functions. Alternatively, the network server, the firewall, and the application server may be implemented by a single server executing computer programs to perform the requisite functions.

As depicted in FIG. 1, the host system 104, the user systems 110 and the adaptors 112 are interconnected via the server network 106 and the device network 116. The server network 106 and the device network 116 depicted in FIG. 1 are in communication with each other. The server network 106 and the device network 116 may be any type of known network including, but not limited to, a wide area network (WAN), a local area network (LAN), a global network (e.g. Internet), a virtual private network (VPN), and an intranet. In addition, the device network 116 may be a copper wire network using existing or new electrical wires. The server network 106 and the device network 116 may be implemented using a wireless network and/or any kind of physical network implementation. User systems 110 and/or adaptors 112 may be coupled to the host system 104 through multiple networks (e.g., electrical wire network and Internet) so that not all user systems 110 are coupled to the host system 104 through the same network. Alternatively, the user systems 110 and/or adaptors 112 are coupled to the host system 104 through a single network (e.g., via the server network 106). One or more of the user systems 110, adaptors 112, and host system 104 may be connected to the server network 106 and/or the device network 116 in a wireless fashion. In an exemplary embodiment, the server network 106 and the device network 116 include both wireless components and wired components.

The storage device 108 depicted in FIG. 1 includes status data, environmental data, device data, analytical data, billing data, physical enterprise model data, and other data related to the computer based on-demand energy management functions. The data in the storage device 108 may be stored in a database format (e.g., a relational database format) and accessed for reporting via a database reporting tool. The storage device 108 may be implemented using a variety of storage devices for storing electronic information. It is understood that the storage device 108 may be implemented using memory contained in the host system 104 or it may be a separate physical device. The storage device 108 is logically addressable as a consolidated data source across a distributed environment that includes the server network 106 and the device network 116. Information stored in the storage device 108 may be retrieved and manipulated via the host system 104 and/or via one or more user systems 110. In exemplary embodiments of the present invention, the host system 104 operates as a database server and coordinates access to application data including data stored on the storage device 108. In the embodiment depicted in FIG. 1, the storage device 108 is connected to the server network 106 (e.g., in a wireless or wired fashion) and is accessed by the host system 104 via the server network 106. In alternate exemplary embodiments, the storage device 108 is directly connected to the host system 104.

Also depicted in FIG. 1 is an environmental data collector 102 that is connected to the device network 116 for collecting information from sources such as calendaring software applications and weather forecasts. This information is utilized by the energy management host software to determine which commands to send to the adaptors 112. FIG. 1 is an example system that may be implemented, and other systems are possible without departing from the scope of the invention. For example, in an alternate exemplary embodiment, there is no environmental data collector 102. In a further alternate exemplary embodiment, one or more environmental data collectors 102 are included in or attached to one or more of the devices 114 (e.g., a heating device or lighting device). In a still further alternate exemplary embodiment, one or more environmental data collectors 102 are included in or attached to one or more of the adaptors 112. In yet a further exemplary embodiment, one or more environmental data collectors 102 are connected to the server network 106. Environmental data in this case may include, but is not limited to, air temperature near the device 114 and air humidity near the device 114, as well as motion detectors, and occupancy access card devices designating that a space is occupied.

The adaptors 112 depicted in FIG. 1 are utilized to connect existing devices 114 to the device network 116. The adaptors 112 receive commands from the energy management host software on the host system 104 and communicate these commands to the attached device 114 (e.g., heating device, lighting device, switch control device). Additionally, the adaptor 112 may receive status data (e.g., actual usage data) from the device 114 and communicate the status data to the energy management host software. An adaptor 112 may be located external to a device 114 or may be integrated into the device 114.

As depicted in FIG. 1, and described in more detail herein below, an adaptor 112 may be located at a control device 114 as well as/or instead of at an individual energy device 114. In an exemplary embodiment, the adaptor 112 may perform different functions when it is located at a switch device 114 than it performs when it is located at an individual energy device 114. For example, an adaptor 112 at a control device 114 may be utilized to enable control (e.g., to turn individual energy devices 114 connected to the control device 114 on or off), while an adaptor 112 at individual energy device 114 may only measure energy usage of the device 114. Any number of other divisions of functionality between adaptors 112 located at a control device 114 and adaptors 112 located at an individual energy device 114 may also be implemented. For example, an adaptor 112 located at a control device 114 may enable control and measure energy usage of individual energy devices 114 pre-wired and connected to the control device 114 that don't have their own adaptors with a control or measurement function. In another example, the adaptor 112 may only perform control functions for its connected energy devices, but another adaptor at the energy device level may only perform a usage measurement function for the specific energy device. Both control and usage measurement functions may be possible at the control device level and at the energy device level.

In an exemplary embodiment, the component based utility bill management software is located on the host system 104 as part of the energy management host software, and the billing data and status data is located on the storage device 108. Both are accessed via a user system 110. In an alternate exemplary embodiment, the component based utility bill management software is located on another host system or on a user system, and the billing data and status data for a particular facility (or other subset of devices 114) is located on another storage device.

The configuration depicted in FIG. 1 is intended to be exemplary in nature and other configurations may also be implemented to perform the functions described herein without departing from the scope of the present invention. An example of this would be to connect multiple OPEN networks together for multiple facilities, either for one or multiple customers for the benefit of managing multiple facility energy networks. This could enable a large utility to have visibility and in some cases limited control for all customers on the OPEN network.

Figure 2:
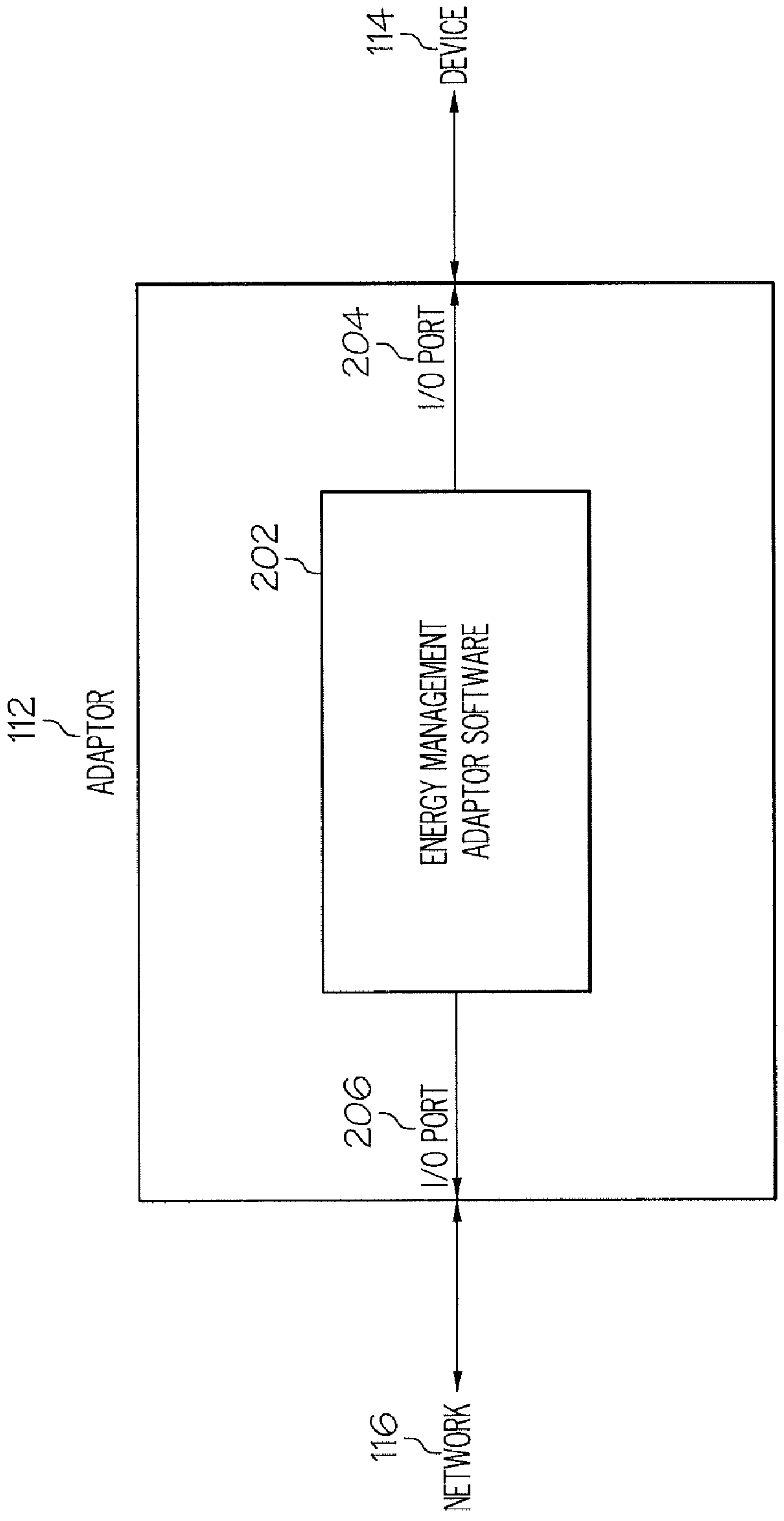
FIG. 2 depicts an adaptor that may be implemented by exemplary embodiments.

FIG. 2 depicts an exemplary adaptor 112 that may be implemented by exemplary embodiments of the present invention. The adaptor 112 is utilized to connect existing devices (e.g., control devices and energy devices) to the device network 116. The adaptor 112 includes an I/O port 206 for communicating with the device network 116 and an I/O port 204 for communicating with the attached device 114. In exemplary embodiments, the adaptor 112 communicates with the device network 116 in a wireless fashion and with the device 114 via an existing copper wire infrastructure.

The adaptor 112 receives commands from the energy management host software on the host system 104 and communicates these commands to the attached device 114. Additionally, the adaptor 112 may receive status data from the device 114 and communicate the status data to the energy management host software. In exemplary embodiments, the adaptors 112 include energy management adaptor software 202 to perform these functions. The functions performed may vary based on the type of device 114 that is attached to the adaptor 112. In exemplary embodiments, the energy management adaptor software 202 is implemented by one or more of hardware (e.g., circuitry) and software instructions located on an integrated circuit on the adaptor 112. The device may be attached to the adaptor 112 in a number of manners. For example, if the device is a lighting device 114, then the adaptor 112 may be located in the bulb socket or in the wall outlet at the point where the lighting device 114 is plugged in. In alternate exemplary embodiments, the functionality described herein with respect to the adaptor 112 is performed within a device that has been manufactured to connect to the device network 106 (i.e., the adaptor functions are integrated into the device). In an exemplary embodiment, the adaptor 112 utilizes industry standard protocols to communicate with the devices and with the device network 116.

Energy Management Host Software Embodiments.

Much of the world is already connected by electrical wires that run in homes, buildings and even along roads and on sports fields. Basic questions about energy utilization (e.g., how much energy is utilized by particular devices, and when the energy is utilized) are difficult to answer. The basic problem lies in the traditional method for switching energy on and off, or even managing and controlling when energy is needed for heat, lighting, cooling and basic appliance use.

The current system used throughout the world in business and residential spaces is primarily an inflexible, manually driven system, with small pockets of alternative methods of control, like thermostats that run on fixed or inflexible calendars that are too rigid to optimize usage. The current method of energy management typically includes an on premise model that requires an individual to manually control devices. A given medium sized company may have 500-1,000 devices that draw energy, and the average home has more than 50-200 devices. Using current methods, energy management and control is clearly inefficient and almost impossible or impractical, because it requires individual manual device control, or pre-established inflexible timers, and the requirement to interface with each device separately. This is contrasted to the ability of exemplary embodiments of the present invention to have group or multi device management from one common source that can be automated through specialized computer software. This "one to many" control method may be utilized to reduce consumption through optimization more than any other method invented to date. In addition, better optimization is achieved using exemplary embodiments through more sophisticated control methods based on an unlimited set of control algorithms using computer software technology. This new method of management may be utilized to conserve large amounts of energy, and to simply offer more efficient productivity or lifestyle through better use of energy.

Computer calendars and web-based access are currently available from a variety of locations, including laptops, fixed personal computers and even mobile devices. Exemplary embodiments utilize these capabilities to provide intelligent computer based on-demand energy management. A software controlled energy management network is created by connecting all premise based or remote electrical devices so that they can be controlled and operated using a computing device, or series of computing devices, using specialized web based software that allows "one to many" management of all devices on the energy management network. This software is secure, and offered on-demand in a completely accessible web based model to large and small companies, as well as residential energy customers.

In exemplary embodiments, computer based signaling and switching controls the functions of turning devices (e.g., fixtures, lights, heating/cooling devices, and other appliances that operate on electricity or battery) on and off, running temperature methodologies, traffic methodologies, etc. based on user controlled individual/group calendars or other on-demand requirements, including but not limited to traffic management algorithms either pre-established or in real time. This versatile system of managing energy tied directly to the individual/group calendar is utilized for personalized energy management at home and work. This is implemented by a computer or mobile device that enables management and control of energy for business or personal use remotely on-demand from anywhere in the world with web based access.

A specialized on-demand energy management software tool is provided via the web through a hosted model to small, medium and large enterprises or organizations throughout the globe. The system is designed to allow one or more individuals, though a secure model and with an easy to use computer web based interface, to manage and control the variety of energy use within, and outside, the four walls of an enterprise or facility. The system uses a software based device control method to turn on and off, or control degree of activity, or the timing of activity (e.g., like necessary in heating and cooling systems) of energy using devices from a computer web based interface. The system also provides complete visibility of energy usage at any level of detail required, including room, device, or even person. This reported cost information is used to further manage and optimize, analyze, do comparisons to utility billing systems, and even distribute costs and usage by cost center, or to users for analysis.

Exemplary embodiments utilize a combination of computers, specialized software that enables users to manage and control electrical devices (e.g., fixtures and appliances), and specially designed devices that can receive and transmit signals either over the electrical wire itself, or wirelessly over a wireless network. Users may interact with the specialized software components operating on either one or multiple computer servers, and easily accessible over the web by the user (e.g., via a user system such as a laptop, desktop, or mobile device) over the Internet or internal network on-demand. This access may be controlled by an individual secure user id and password. The software allows the user to view and see all of the devices available on the energy management network, which would include all assigned devices (with adaptors) that have been installed to communicate with the energy management network.

Exemplary embodiments allow control and reporting of energy usage related to individual people that reside in certain rooms, and groups of people, for example, using on-line calendars that include an individual's calendar for when they will be present in a room or facility, and/or group calendars to manage the overall calendar of the group, including vacation days and mass utilization capability. Exemplary embodiments also provide the ability to monitor status of devices and automatically notify users (e.g., via an alert) when maintenance, repair, or replacement is necessary. This notification system can also be networked directly to the manufacturer for on-demand and real time maintenance needs.

An auto management function in exemplary embodiments monitors environmental and/or degree of activity conditions in real time by feeding temperature or lighting conditions, or even traffic patterns into the software and thereby providing the ability to adjust energy usage or timing according to real time conditions. For example, if it is very sunny out, the system can be set up to manage down lighting and rely more on natural light, rather than burning energy that is man-made. Also, in the event that a temperature change is expected from the weather predictions, heating or cooling devices can be commanded automatically to reduce/raise temperature in anticipation of relying on natural shifts in weather. Another example is to manage stop light timing through traffic patterns as opposed to using a timer methodology. Special formulas can be executed that manage energy efficiently across the changing patterns that people often have in businesses or in homes. In addition, in the event that a unique on-demand situation exists, remote or local energy management can be simple and fast all from one computer interface to manage an entire facility easily with the push of one button that can notify all devices, or a customized predetermined group of devices, on the energy management network of a particular requirement. An example would be when employees in a facility are given early leave and the building is vacated. In this case, a software-based command can be executed that invokes all devices to come down into building empty mode for optimized effect.

In a quick analysis, for a business that spends approximately $50,000 per month on total energy use, that means that any 4 hour period in that month can cost approximately $50-$200/hour depending on the time of day and usage conditions. In a traditional unmanaged environment, making an announcement to employees for an early leave can actually cost the company an extra $800 in energy waste. In a typical home spending about $4,000 per year, leaving for a weekend in a traditional unmanaged environment can cost the family an extra $20 in energy waste for one weekend. By utilizing exemplary embodiments of the present invention to monitor and conserve energy, energy costs may be substantially lowered.

Exemplary embodiments of the present invention may be utilized to revolutionize the way energy is managed for business customers, along with driving down the total use of electricity throughout the world. An example of this model that can take energy management to the next level is the situation with changing outside temperatures in a certain area, and the fact that thermostats inside a building structure may not be able to predict the expected change in outdoor temperatures. In an exemplary embodiment, a computer controlled model takes computer based weather predictions and runs the heating/cooling devices accordingly by changing the desired temperature prior to expected temperature changes actually happening, thus optimizing the energy use even further. With the rising costs of energy throughout the world, the stakes are higher than ever to marry computer software with energy management for a more optimized outcome. Not only will money be saved, but energy as a scarce resource will be conserved, rather than wasted as in the obsolete models in use today.

Exemplary embodiments of the present invention utilize "smart devices" where the functions of the adaptor described herein can be separate or included in the device. Existing devices require a specialized adaptor (or socket) to be applied to standard devices (e.g., lighting and electrical devices). The special adaptor may be implemented as a specialized plug placed in a wall socket to provide the ability to communicate with the energy management network. The adaptor provides an interface between a device and a computer application server to receive and transmit data for management and control, as well as for basic commands such as on, off, etc. In exemplary embodiments, each device has an adaptor that is located between the device and the electrical socket, or between a free-standing device and the plug, or connected in some other manner to the computer software for control and monitoring information flow. Heating devices, air conditioning units, lighting, fans, etc. will all be able to be operated remotely from standard computer devices, as well as standard mobile data devices, such as Treo's and Blackberrys.

Currently, the public utilities have not provided control and analysis to this level of detail. Exemplary embodiments of the present invention will revolutionize the way that energy is used and managed in the same way the iPod changed the way music is distributed and used because it breaks down the unit of measurement to a more granular level and is made quite visible (as opposed to being completely hidden as is the case in the current energy management methods). This may result in a large cost savings to energy consumers due to decreased energy usage. Energy management host software is on-demand available to corporations and governments, large and small. Other exemplary embodiments include adaptors that easily connect to devices in a facility or in remote areas like roads, schools, and sports complexes. These adaptors use standard industry protocols that communicate to a network created in each facility in one of two ways, or a combination of both. The first method of connecting includes using the existing copper wires used to carry the electricity in the infrastructure. The second method of connecting includes using a wireless network that communicates with each adaptor. Each device on this newly created local energy network becomes an individual measurable node on the network. All individual networks may be rolled up to form an entire network of all energy networks, allowing government and regulated utility organizations to monitor and even sometimes manage energy use centrally (e.g., for emergency situations caused by power outages requiring notifications and repair)

Figure 3:
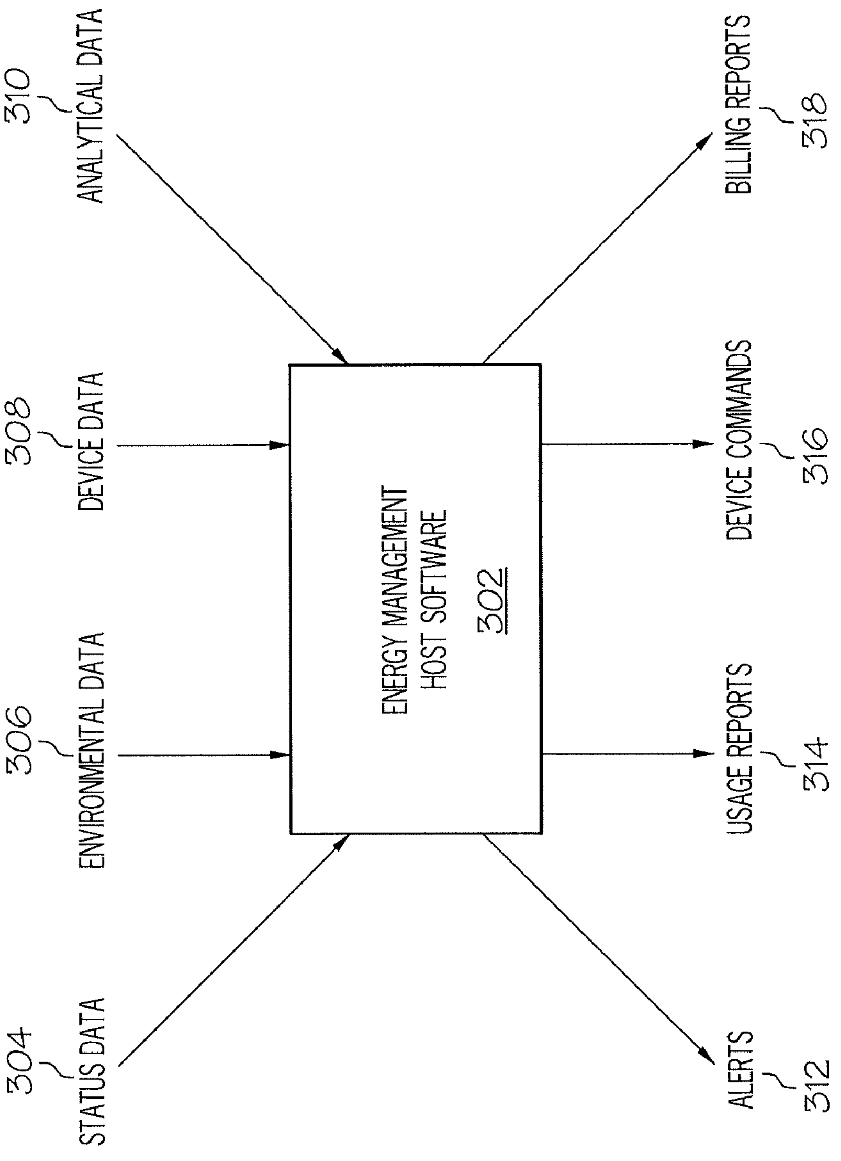
FIG. 3 depicts a block diagram of a data flow that may be implemented by exemplary embodiments.

FIG. 3 depicts a block diagram of a data flow that may be implemented by exemplary embodiments of the present invention. The energy management host software 302 receives one or more of status data 304, environmental data 306, device data 308 and analytical data 310 related to one or more devices. The status data 304 (also referred to herein as energy usage data) includes information about whether a device is currently powered on, and may include other information such as a current operating temperature or maintenance information (e.g., is a bulb working). Typically, the status data 304 is received from the devices (e.g., via an adaptor). The environmental data 306 includes information about the operating conditions external to one or more devices and may be received from one or more environmental data collectors 102. Environmental data 306 may include, but is not limited to, air temperature, weather forecasts, traffic patterns, occupancy data, motion detector data, and calendar data. As described previously, the calendar data may be utilized to determine when to power on particular devices as well as particular setting that should be applied to the devices (e.g., temperature). The environmental data 306 may also include any kind of information that can be utilized to control the devices such as, but not limited to, motion detectors and access cards that notify a location that someone is in a facility.

Device data 308 includes information about each device or a group of devices in the energy management network. The device data 308 may include, but is not limited to, device location, settings available on the device and alert conditions associated with the device. The device data 308 may be automatically determined by the energy management adaptor software 202, or it may be entered by a user at a user system 110. Analytical data 310 is typically created from user input at a user system 110 as well as the status data 304, the environmental data 306 and the device data 308 and includes report information. The analytical data 310 may also include stored report formats and associated database queries.

Outputs from the energy management host software 302 include alerts 312, reports 314, device commands 316, and billing reports 318. The alerts 312 may be generated when a light bulb burns out, or when a device that should be operational is powered off, or when a device has reached a threshold defined in the device data 308, etc. The alerts 312 may be transmitted to a user system 110 such as a handheld device, computer device, or cellular device to alert a user of the situation. Each alert 312 may be transmitted to the user system 110 in a batch and/or real-time manner depending on implementation requirements.

The reports 314 and billing reports 318 may be generated based on a user request at a user system 110, automatically on a periodic basis and/or when exception conditions occur. The reports may specify any level of granularity such as data for an individual device or for all devices of a particular type, for a person, for an office, for a group of offices, for a building, and for a site. The reports may include usage information that is generated based on the status data 304. In addition, the reports may include all or a subset of the status data 304, all or a portion of the environmental data 306, and all or a portion of the device data 308. All or a subset of a report 314 may be stored as analytical data 310 in the storage device 108.

Reports 314 may be generated to analyze energy usage and patterns, as well as utilization and timing. In addition, the reports 314 may be generated to perform (or be input to) cost accounting, budgeting and planning. All or portions of the reports may then be distributed to users with the information broken down by device, location, room, department, person, etc. Energy usage reports 314 may also be generated to compare actual usage with the bills from the utility. Further, billing reports 318 may be utilized to bill a customer for energy usage (internally within a company as part of cost accounting, or a utility company billing a customer).

The device commands 316 are generated by the energy management host software 302 in response to a user request via a user system 110, in response to status data 304 for the device, in response to environmental data 306, and/or in response to device data 308. The environmental data 306 may include calendar data for the user of the device. The calendar data may indicate when the user is in the office and any long-term absences when the energy usage can be adjusted (e.g., turn heat down, no cross street traffic so leave stop light green).

The device commands 316 will vary based on the type of device. Lighting device commands may include power on, power off, and a light dim setting. Heating and air conditioning device commands may include power on, power off, and temperature setting. Stop lights may include color setting on and off. Appliance device commands may include power on, power off, and device settings (e.g., power level for a humidifier). Electronic/computer device commands may include power on, power off, and device settings (e.g., record commands for a DVD player).

Thus, by providing an interface to each device, each device may be managed individually or within a group of other devices. For each device, it is possible to determine usage and usage patterns (e.g., based on time of day, day of week, etc.) and to control the status of the device (e.g., on/off, temperature, etc.). The status may also be controlled using environmental data 306 as input. In this manner, the energy management host software provides one-to-many management of energy usage of devices in an energy management network. In addition, the commands utilized to control the devices may be generated remotely (e.g., by a user or in response to detecting the existence of particular conditions).

Figure 4:
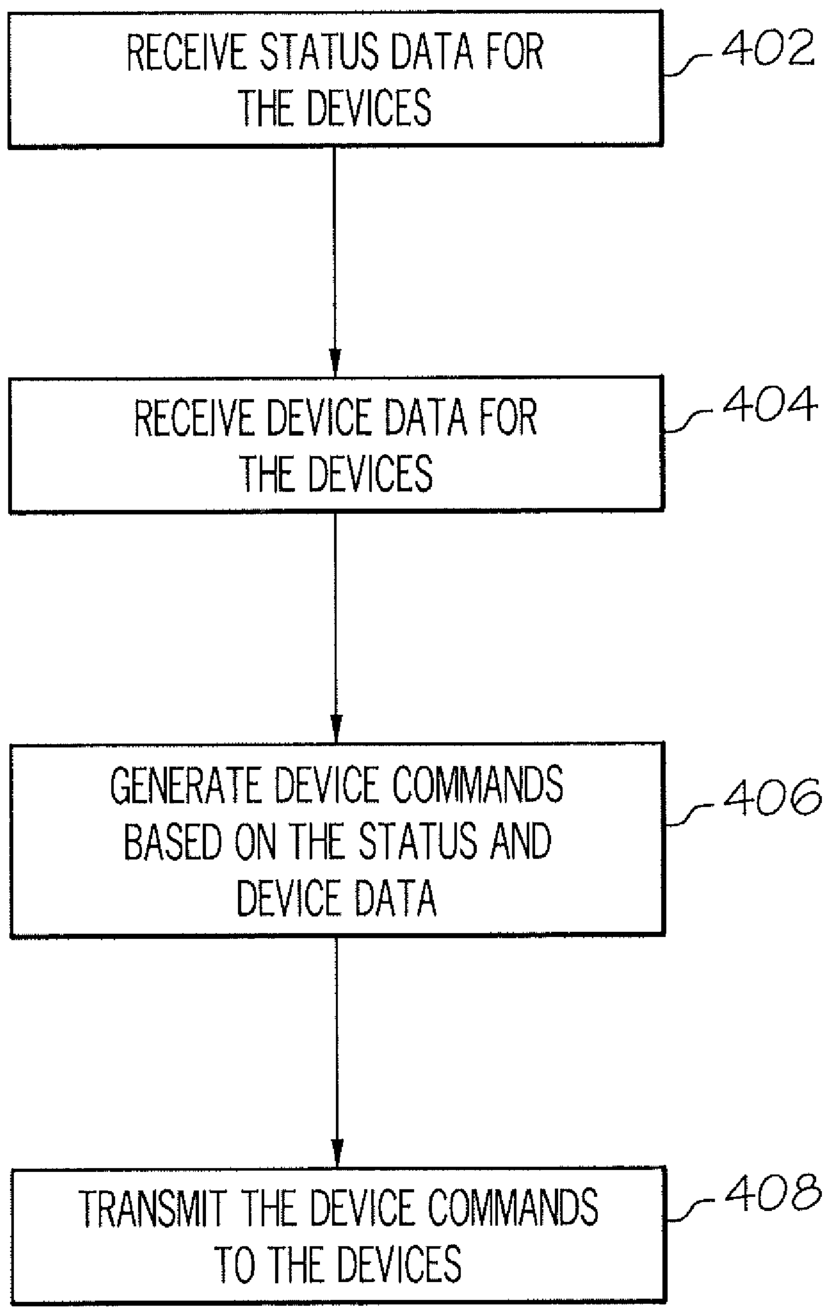
FIG. 4 depicts a process flow for transmitting commands to devices that may be implemented by exemplary embodiments.

FIG. 4 depicts a process flow for transmitting commands to devices that may be implemented by exemplary embodiments of the present invention. In an exemplary embodiment, the process depicted in FIG. 4 is performed by the energy management host software 302. At block 402, the energy management host software 302 receives status data 304 for one or more devices. The status data 304 may be stored and utilized to generate energy usage reports. At block 404, device data 308 is received for the one or more devices. As described previously, the device data 308 includes information about what kinds of commands are valid for particular devices and conditions for which an alert should be generated, if any. At block 406, device commands are generated based on the status data 304 and the device data 308. The device commands may relate to a particular device or to a group of devices. At block 408, the device commands are transmitted to the devices (e.g., via the adaptors).

Figure 5:
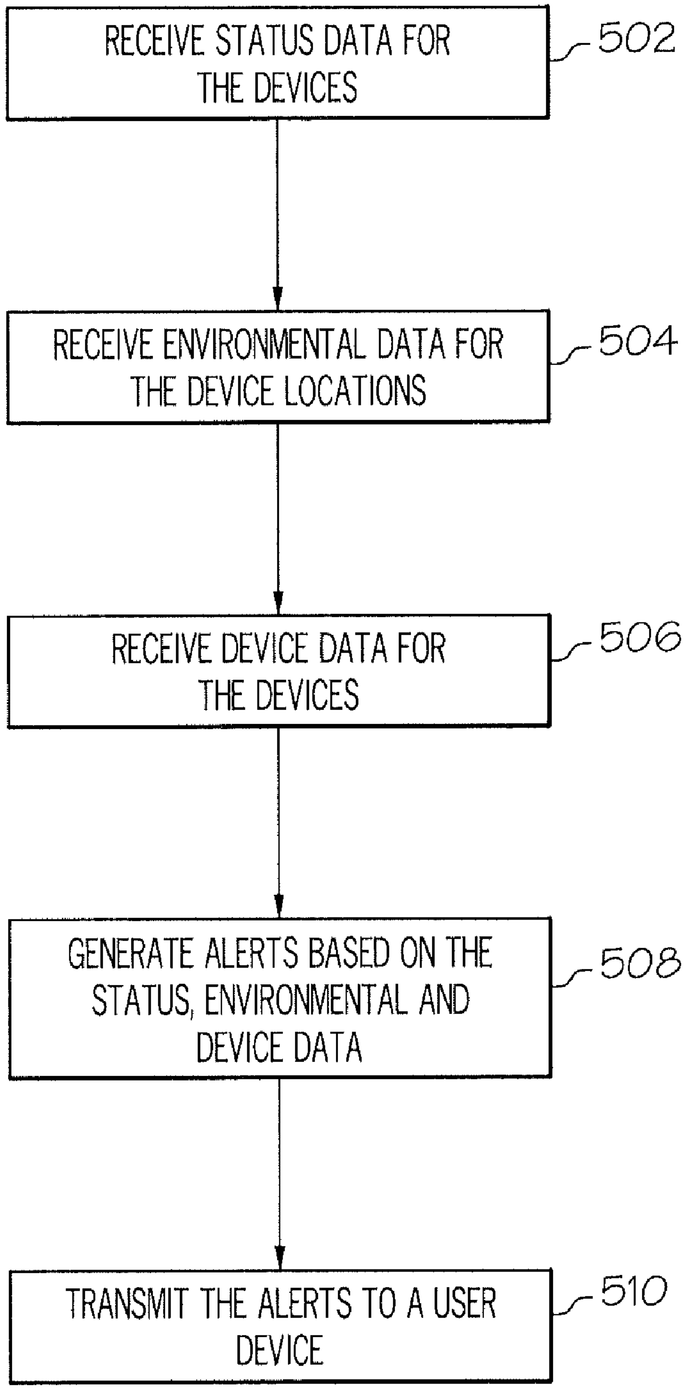
FIG. 5 depicts a process flow for transmitting alerts that may be implemented by exemplary embodiments.

FIG. 5 depicts a process flow for transmitting alerts that may be implemented by an exemplary embodiment of the present invention. In an exemplary embodiment, the process depicted in FIG. 5 is performed by the energy management host software 302. At block 502, the energy management host software 302 receives status data 304 for one or more devices. At block 504, environmental data 306 is received (e.g., from an environmental data collector 102) for one or more of the device locations. At block 506, device data 308 for the one or more devices is received. At block 508, alerts are generated based on one or more of the status data 304, environmental data 306 and the device data 308. At block 510, the alerts are transmitted to a user system 110.

Energy Management Software Billing Embodiments.

Current billing methods utilized by utility companies are consistent in that they bill all usage equally, and do not delineate cost or usage by device (e.g., appliance, lights, heating devices, switches) or rooms, or individual people. These antiquated billing models provide no way to delineate or report back to the customer billing by time of day for each device as well, and therefore cannot even effectively offer price differential by type or time of usage. Energy billing has historically been only bulk usage billing, with little to no ability to bill by energy device or control device. The power of a billing model that actually creates a level of detail that the customer can review and analyze is truly unique, and will change the way people manage and conserve energy more than any other invention in this area to date.

The current billing system used throughout the world in business and residential spaces is primarily an inflexible, manually driven system. The measurement mechanism is performed at the facility level, which simply groups all energy devices and appliances by building, with no regard to a more granular level of measurement. Also, the utility meter is used for measurement along the copper wire where the utility service enters the facility. In reality, actual usage is occurring at the device or appliance level and only kilowatts are being measured at the meter for all facility devices. Since control is at the device level, and not really at the facility level, there is a disjoin between the billing detail or lack thereof, which is at a summary level for an entire facility, and actual control, which is typically done by area control devices (e.g., switches) or by individual users of the energy with little awareness of costs because the bill does not report at this level. This limits the ability to provide visibility and costs at the level of control so users can actually use the bill as a management tool as is done in telecommunications situations for long distance or cell phone usage.

The implications of exemplary embodiments of the new billing model described herein are widespread as the new billing model completely removes the need to read meters, and removes the existing limitation of not being able to report charges by device on a bill (as described previously, current bills only provide summary meter charges by facility or meter).

For the first time in history, the bill can actually become a useful tool to enable people to manage their costs and usage at the level of detail necessary to control each device in real time.

Other benefits of exemplary embodiments of the new billing model have to do with real time availability of information for billing purposes. Typically the energy bill arrives once each month in only summary form. The new billing model, when coupled with the energy management host software, provides real time billing information right up to the minute or even second, and can be used to manage costs in real time, as opposed to once a month. Also, accounting departments can actually manage month end cut offs and not have to accrue for costs just because a bill has not arrived yet.

The utilities providing the service will also have the ability to gain visibility of usage data from entire facilities for the benefit of understanding their customers much more, and can actually assist with pattern management capabilities which can train customers to better utilize the service for efficiency and even convenience. Also, the ability to control each device could go into the hands of the utility for potential emergency override in the event of a major energy shortage. Using exemplary embodiment, controlled rationing could be accomplished centrally, assuming the customers were to allow this level of control. This could become an optional program for certain customers, possibly giving back financial incentives to customers who participate in the program. It is also possible the government would want to retain this degree of control.

Utilizing exemplary embodiments, utilities could publish average costs for certain devices as well as use the new billing data for benchmarking customers for free (or for a fee) to make recommendations on how to become more efficient based on best practices. Much more proactive management and visibility is practical for the first time by utilizing exemplary embodiments of the billing software.

Further, utility costs could be dramatically reduced by removing meter reading efforts and switching over to the new computer based model.

It is also possible to charge different rates for different devices depending on the goals. Certain higher value appliances may have certain benefits over lower efficient devices. A utility company could create incentives for people to replace older less efficient devices with newer more efficient models. This incentive may come in simply lower rates for more energy efficient devices. Also given visibility at the device level, inefficient energy opportunities become evident immediately in real time each month as bills are presented. These can be highlighted immediately each billing period until replaced. Currently, inefficiencies are hiding in the pile of facility energy spent because there is only summary data available on the utility bill and on the meter.

Competitive utility companies have sprouted up due to deregulation for the purpose of providing competitive alternative energy sources as an alternative to the limited public utilities. Even though these competitive companies are buying wholesale from the larger existing utilities, they can also take advantage of the newer more granular billing methods described herein thereby gaining a distinct advantage over the older monopolies. All distribution goes through the regulated utility in either case and the billing function may remain with these monopolies given they will still own distribution including the billing model. This may only be because the meter is owned by these companies and practically they may be the only ones that can read the meter and have the infrastructure to read them. Exemplary embodiments may be utilized by competitive energy companies to provide a much more comprehensive bill and resulting set of related services using this new billing data. By owning this new capability, the concept of competition would be enhanced dramatically by shedding another monopolistic function away from the larger incumbents. Distribution would remain with these larger utilities, but most of the value added service would shift towards the competitive energy provider under this new model.

Exemplary embodiments provide the capability of assigning internal cost centers to the devices in the software, which allows the billing model to offer integration to the enterprise accounting system for allocation chargebacks, and usage presentment at the division, group, facility, room, or employee level. These groupings may be rolled up and down by device, and other relevant levels of detail.

Usage management is taken to a new level under this billing model, which allows variable pricing for devices (e.g., varying by time of day, or even location or type of device). Variable rate pricing enables the utility to know which usage patterns to bill for, and the customer for the first time can actually manage usage better with lower pricing options, capitalizing on spreading out usage during off peak times vs. high peak times for cost management. Current billing models in use today leave little to no visibility for the customer to manage to optimum rate periods during the day, week or month.

Exemplary embodiments include a specialized on-demand energy management software tool that is provided via the web through a hosted model to small, medium and large enterprises or organizations, as well as residential homes throughout the globe. The system is designed to allow one or more individuals, though a secure model and with an easy to use computer web based interface, to manage and control the variety of energy use within, and outside, the four walls of an enterprise or facility. The system provides complete visibility of energy usage at any level of detail required, including room, device, or even person. This reported cost information can be used to further manage and optimize, analyze, do comparisons to utility billing systems, and even distribute costs and usage by cost center, or to users for analysis.

Exemplary embodiments utilize a combination of computers, specialized software that enables users to manage and control devices (e.g., fixtures, switches, and appliances), and specially designed devices that can receive and transmit signals either over the electrical wire itself, or over a wireless network. Users may interact with the specialized software components operating on either one or multiple computer servers, and easily accessible over the web by the user (e.g., via a user system such as a laptop, desktop, or mobile device) over the Internet or internal network on-demand. This access may be controlled by an individual secure user id and password. The software allows the user to view and see all of the devices available on the energy management network, which would include all assigned devices (with adaptors) that have been installed to communicate with the energy management network. The software also allows customers to view billing and usage data for all assigned devices.

Exemplary embodiments allow control and reporting of energy usage related to individual people that reside in certain rooms, and groups of people, for example, using on-line calendars that include an individual's calendar for when they will be present in a room or facility, and/or group calendars to manage the overall calendar of the group, including vacation days and mass utilization capability. Exemplary embodiments also provide the ability to monitor status of devices and automatically notify users (e.g., via an alert) when maintenance, repair, or replacement is necessary. This notification system can also be networked directly to the manufacturer for on-demand and real time maintenance needs.

Figure 6:
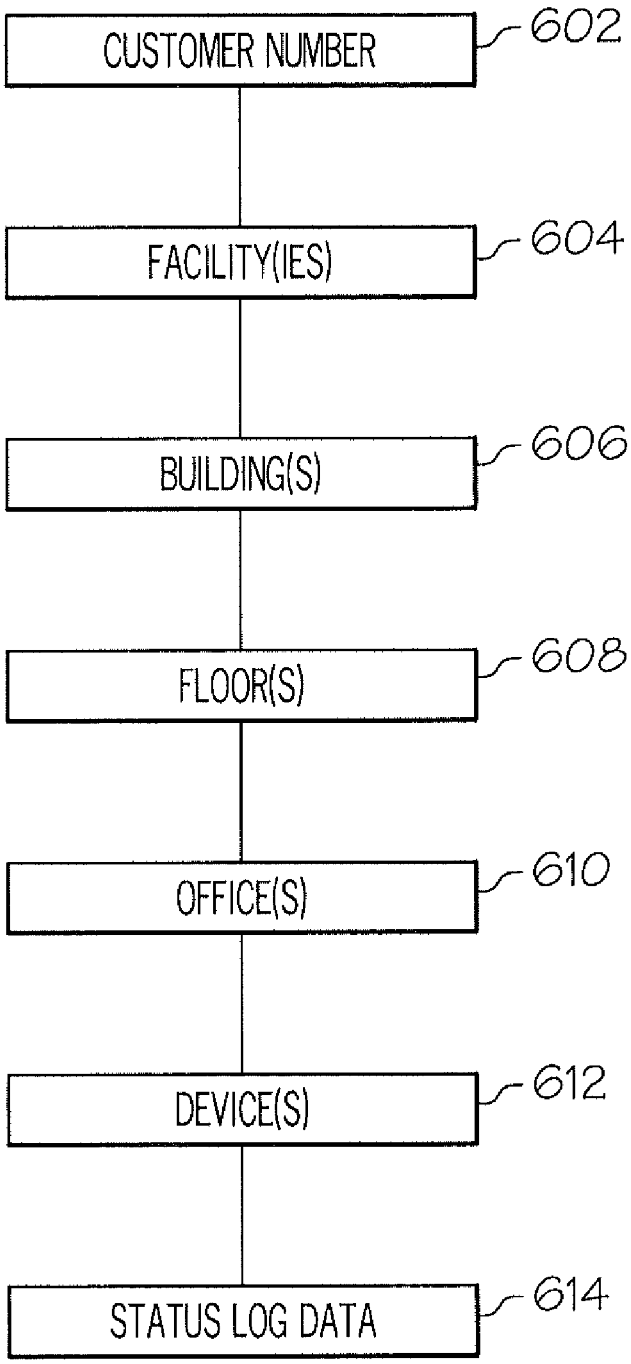
FIG. 6 depicts billing data that may be utilized by exemplary embodiments.

FIG. 6 depicts an exemplary billing data layout 600 that may be utilized by exemplary embodiments of the present invention. In an exemplary embodiment, the billing data layout 600 is stored on the storage device 108. In an alternate exemplary embodiment, a copy of the billing data specific to a particular customer or other subset is also stored on a storage device accessible by the customer for creating billing and usage reports. The billing data includes a customer number field 602 to identify the customer. Each customer number field 604 may be associated with one or more facility fields 604 (e.g., a division of a company, a geographic location, etc.). Each facility field 604 may then have one or more building fields 606 with each building field 606 having one or more floor fields 608. Within each floor field 608 are one or more office fields 610 (or conference rooms, etc.). Each office field 610 will have one or more device fields 612 and associated status log data fields 614. In an exemplary embodiment, status data includes information about whether a device is currently powered on, and may include other information such as current operating temperature or maintenance information (e.g., is a bulb working). Typically, the status data is received from the devices 114 (e.g., via an adaptor). In an alternate exemplary embodiment, status data returned from the device 114 includes actual amps/watts utilized and/or actual total time powered on. In an exemplary embodiment, the status log data field 614 includes a time stamp associated with the device 114 being powered on and powered off. The status log data field 614 is utilized to extrapolate usage data for each device 114.

The billing data layout 600 depicted in FIG. 6 is intended to be exemplary in nature and other data layouts may also be implemented to perform the functions described herein without departing from the scope of the present invention. For example, the data layout may not include the floor field 608, or the data layout may include some other manner of grouping the device fields 612 such as department or individual employee. In addition, the device fields 612 may be associated with device types and energy usage fields for particular types of devices 114.

Figure 7:
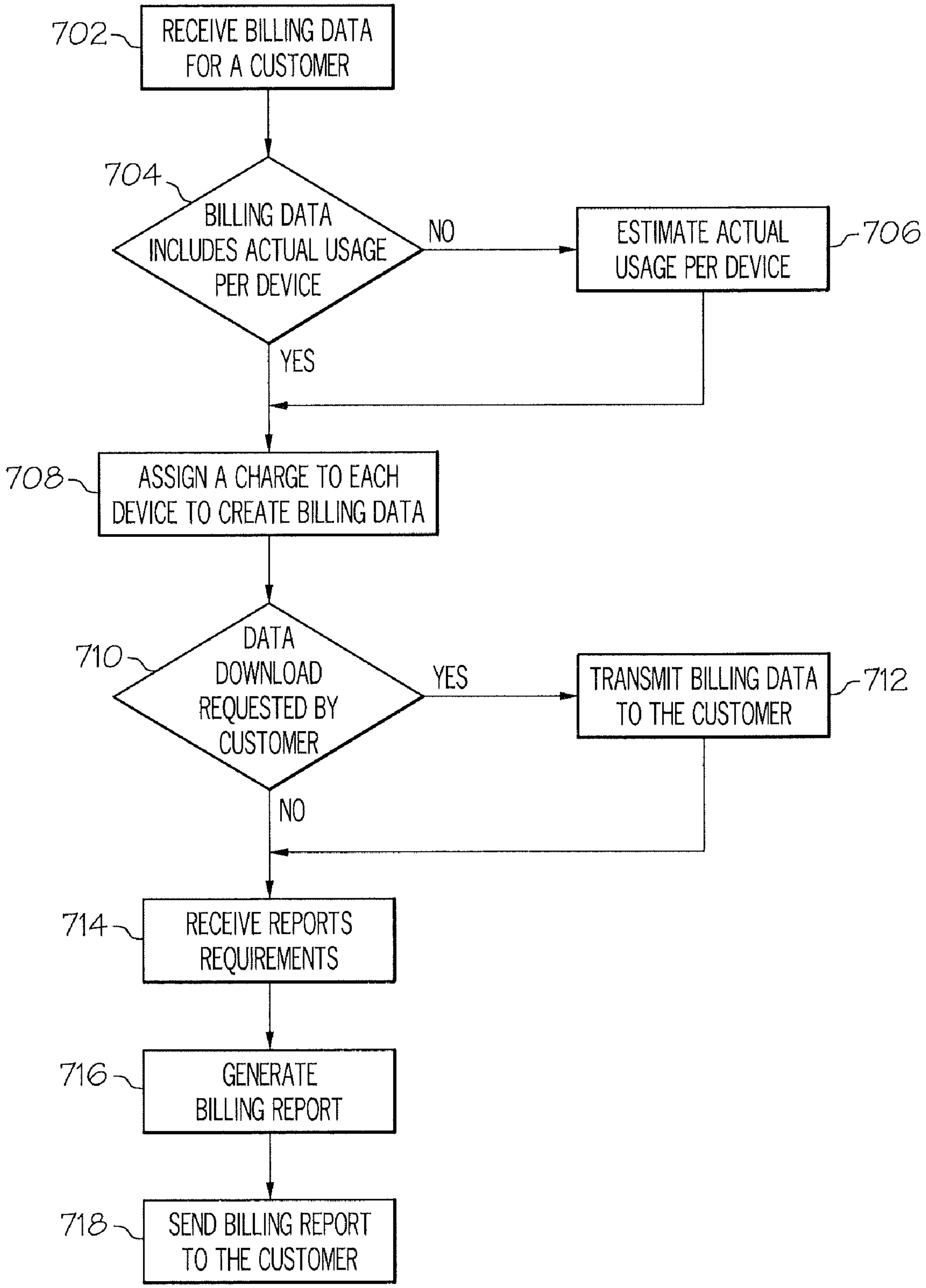
FIG. 7 depicts a block diagram of a process flow for providing component based utility bill management that may be implemented by exemplary embodiments.

FIG. 7 depicts a block diagram of a process flow for providing component based utility bill management that may be implemented by exemplary embodiments of the component based utility bill management software. At block 702, billing data for a customer is received or accessed by the software. The billing data received or accessed may be all or a subset of the billing data for the customer, and it may include combined data for two or more customers. In an exemplary embodiment, the billing data is in the billing data layout 600 as depicted in FIG. 6, though other layouts and content may also be utilized by alternate exemplary embodiments.

At block 704, it is determined if the billing data includes actual usage information (also referred to herein as "energy usage data") for all of the devices 114. If one or more of the devices 114 in the billing data do not have data reflecting the actual usage of the device 114, then block 706 is performed and the actual usage per device 114 is estimated. Any manner of estimating may be utilized. The most basic form of estimation would be to log (automatically from the adaptor 112, or manually into the inventory segment of the energy management software which tracks all types of devices 114) all of the device specification data available for each device 114, such as watts, amps, etc. For example, the average energy use can be calculated from these specifications in a fairly accurate way based on the time the device 114 or devices 114 are turned on. In another example, where the actual usage of devices 114 in an entire building are not known, the usage can be estimated by knowing the total amount of usage for the building, the number and type of devices 114 in the building, and the amount of energy that a particular type of device 114 is supposed to utilize per hour based on its stated specifications from the manufacturer. In addition, an estimate of the hours that a device 114 is typically in use may also be applied to the calculation. Statistical models could also be utilized to estimate the usage per device 114. Processing then continues at block 708.

It is anticipated that a second actual meter could be placed inside the facility that is owned by the customer or user, that acts in a way very similar to the traditional utility meter that the utility owns, and that this internal meter will be connected to the energy management software either wirelessly, or over the copper wire itself. This actual meter can be used to cross check the utility meter, and also to assist in the set up of adaptors and the overall cost measurement of all devices 114 on the OPEN network. This would produce an available real time summary of actual usage, which could be used in concert with estimated usage by device 114 to produce a complete bill and to reconcile the difference between actual overall usage and the addition of all of the estimated or actual usage by device 114. The differences in these two could be isolated for the benefit of an accurate picture where all energy is accounted for in this model.

At block 708, a charge is assigned to each of the devices 114 based on the usage of each device 114. As described previously, the charge may be based solely on the amount of energy utilized by the device 114. In addition, different charges may be applied to different types of devices 114 (e.g., to encourage energy efficient devices 114) and/or different charges may be applied depending on the time of day that the device 114 was utilized. This billing data is then stored in the storage device 108. At block 710, it is determined if the customer has requested that the billing data be downloaded to a customer database. If the customer does request a copy of the billing data, then block 712 is performed and a copy of the billing data for the customer (or a subset as requested by the customer) is transmitted to the customer. The customer can then use reporting tools to analyze the billing and/or usage data. For example, the customer may analyze device usage based on office, certain types of devices 114, certain days, etc. In this manner, the customer can perform detailed analysis of energy usage on a component basis. In addition, the customer may have canned reports that they execute to produce standard billing reports.

At block 714, report requirements are received from the customer. The report requirements may be in the form of the name of a canned report and/or in the form of a database query asking for particular data records. At block 716, the billing report is generated and at block 718, the billing report is communicated to the customer. The billing report may be communicated via any method including, but not limited to electronic mail, a spreadsheet, a database, and regular mail. In addition, the billing data and/or billing reports may be communicated to the customer in a real-time manner. For example, the billing data may be updated every second, or every minute or every hour, or other increment of time. This billing data will be stored in the data storage device 108. In addition, the updated billing data may be transmitted to the customer (if required) every second, every minute, etc. In this manner, a customer can manage energy usage in a real time manner.

FIG. 8 depicts a billing detail report that may be implemented by exemplary embodiments of the present invention. The billing detail report depicted in FIG. 8 may be delivered to the customer as a fixed report or it may be delivered to the customer as an on-line screen. As a fixed report, the example billing detail report depicted in FIG. 8 provides cost and usage information down to the device level. In addition, it provides summary information at the office, floor, building and facility level.

In an alternate exemplary embodiment, the billing detail report depicted in FIG. 8 is delivered to the customer as an on-line screen that allows the customer to view different levels of detail. As depicted in FIG. 8, the customer has requested detailed billing information for the devices 114 in a particular office. The customer could then close out the detailed information about the devices 114 in "office 2" and request detail information about the devices 114 in "office 3".

As described previously, reports of any granularity can be produced and the reports can provide detail and summary information about device usage in the various groupings (e.g., divisions, room device, etc.). Database reporting tools and/or computer programming tools may be utilized to create reports from the billing data. Other fields may be added to the billing data to group the devices 114 in other manners (e.g., by device type, by building type, etc.) depending on customer requirements.

An exemplary embodiment supports cost accounting and includes an automated interface to accounting systems. As described previously, energy is currently accounted for primarily by facility. In some cases, energy usage one level down may be estimated to provide accounting data. This is due to the limitations on billing at the meter level, which is typically by facility. Almost all large enterprises currently account for other expense categories like telecommunications, legal, and shipping using a predefined general ledger cost center breakdown that represents the way the enterprise is structured both physically and logically, by geography, by division, dept, cost center, or even by employee in some cases. These breakdowns are often reflected in a cost center structure that is set up in the enterprise accounting system through the general ledger system, often using computer software systems from companies like Oracle and SAP. Exemplary embodiments of the present invention allow a breakdown to report a level of detail that can represent actual usage and measurement by location.

In addition, exemplary embodiments also provide a lower level of detail that includes device adaptors, while supporting higher level roll ups by floor, room, employee, or any other important attributes that may be analyzed in the enterprise and used for other types of expense reporting and management. Exemplary embodiments allow query and reporting at these levels of detail as well as the ability to interface and integrate this data (e.g., in real time or in batch mode) to an existing enterprise accounting system (primarily the general ledger and accounts payable systems). By enabling this integration, exemplary embodiments provide a complete detailed chargeback ability for energy expense at a more granular level of detail than ever before. Utilizing an exemplary embodiment, enterprises are now able to view, compare, and analyze this expense category and allocate the expenses more specifically to the hierarchical levels in the company that are actually using the energy. This represents a much more accurate and accountable capability, resulting in more responsible use of energy due to this new accountability and visibility, and thus, the cost of energy may be lowered due to better management.

The automated integration of this cost center allocation method in exemplary embodiments enables real time accounting of energy expense for better visibility and reporting in a flexible method that can represent the unique chargeback model that almost any enterprise may be using today. Exemplary embodiments provide a flexible model for setting this hierarchical structure so that reporting the expense is flexible and can be used by most enterprise chargeback methods.

Adaptor Exemplary Embodiments.

The adaptor is a circuit based hardware component with the ability to read and write fixed and variable information to and from various types of energy devices and/or control devices, as well as interact with the specialized energy management software over the OPEN network for the benefit of controlling devices from specialized software based commands, as an alternative and complementary manner over using traditional/existing manually based methods, including but not limited to wall based control devices or self contained thermostats.

There are at least two basic types of OPEN network configurations possible, and obviously any combination of these two is possible in a given facility depending on the level of management and measurement required. The first type places device adaptors at the control device level (referred to herein as control device adaptors or CDAs), which enable measurement and control down to the control device level. The control devices utilize an existing copper wire connection to the pre-wired groups of energy devices. So, for example, the CDA can measure and manage preexisting groups of energy devices hard wired to that control device in the infrastructure over the copper wire.

The second adaptor type is more granular, and places the adaptor at the energy device level (referred to herein as an energy device adaptor or EDA) and can allow measurement and/or even management down to each individual energy device by connecting the energy device itself directly to the OPEN network. Thus, more granular measurement and possibly control is enabled, while driving the control down a level to the lowest level of detail. It is possible that the EDA can provide usage measurement and/or control depending on the requirement or application.

Placing the CDA at the control device attaches the OPEN network connection to the level of detail that can manage groups of energy devices, but not each specific energy device. While this configuration is less costly to implement than an EDA configuration, it is much more granular in terms of detailed management, measurement and control relative to the current facility meter configuration, which is only at the facility level. Obviously, a CDA configuration does not go all the way down to managing or measuring each energy device.

There are at least two separate functions targeted by exemplary embodiments of the present invention. The first is management, and the second is measurement. For purposes of management, if the device adaptor is placed at the control device level in a CDA configuration, then the management function is limited to the existing groups of energy devices physically wired over the copper wire to that specific control device. Therefore, the control simply manages the group of energy devices hard wired over the copper wire to that specific control device. The second function, usage measurement, can be captured at the control device for the group of energy devices hard wired to that specific control device. In this case, all measurement is limited to groups of energy devices, as opposed to each individual energy device. Another possible configuration is to implement a specialized EDA with only the capability to measure, as opposed to manage, usage at the Energy device level, and simply send the data over the OPEN network to the CDA or directly to the centralized server, but not do the management function at the EDA level. This configuration provides at least more granular measurement capability at the EDA level, but leaves control at the CDA level.

Management at the EDA level provides some complexities based on not having energy available at the EDA when the electrical current is turned off, thereby making the automated "turn on" function triggered from the specialized application software more complicated at the EDA level. The CDA level is easier because of a constant flow of current from the utility exists and stops at the CDA level, which makes electric current available at all times to operate the device adaptor at this level. There are several manners of overcoming this EDA "current availability" challenge which are discussed herein below. In summary, any combination of function and connection may be implemented by exemplary embodiments of the present invention depending on the desired application for energy management and measurement. It is important to note that the amount of infrastructure adaptor components required to either change an existing infrastructure, or build out a new one, will be more complex and expensive if there is a requirement to measure and ultimately manage at the energy device level.

The following description further defines three different types of adaptors that may be implemented by exemplary embodiments of the present invention.

Add-on Control device Adaptor (ACDA). The ACDA may be utilized to complement an existing facility or infrastructure by attaching to selected (some or all) control devices in an existing facility. The ACDA takes an existing infrastructure, and connects the attached control devices to the OPEN network. The ACDA enables all physically connected energy devices over the existing copper wire to be controlled more efficiently. The benefits of the ACDA include the ability to use all existing infrastructure components and simply converting an existing infrastructure to the new energy management model contemplated by exemplary embodiments of the present invention. The ACDA allows computer commands from the specialized energy management software (e.g., the energy management host software 104) through the OPEN network to communicate real time to all connected control devices and to either override, or replace manual switching, or even complement the existing method of control, given that the existing control device may still allow manual switching and/or computer based switching. It may also be possible to shut off the manual override function, and to disable the manual method, and only allow computer based control and management depending on the actual application desired. The result is that affected energy devices connected to the control device (e.g., switch device 114) can now be measured for usage, as well as controlled through computer based methods as a complement or replacement to traditional manual methods. This allows energy usage and billing to move to the control device level, a much more granular level than the current facility or department based meter levels used today.

New Control device Adaptor (NCDA). The NCDA is used to replace traditional methods used in an existing or new facility or infrastructure. The NCDA is a newly created integrated control device that may or may not have manual switching capabilities depending on the desired application. This adaptor is manufactured specifically to either replace existing control device types, and can be used to retrofit existing facilities, or for newer construction. The NCDA operates in a very similar manner as the ACDA by attaching to some or all control devices in a facility and enables control via the newly created integrated OPEN network of all of the physically attached energy devices pre wired over the copper wire. The benefits of this adaptor may be utilized to either, replace all existing infrastructure control device components and simply convert an existing infrastructure to the new energy management model contemplated in this invention, or to use the new integrated NCDA in new construction to enable newly built facilities to be OPEN network capable. The NCDA allows computer commands from the specialized energy management software over the OPEN Network to communicate in real time to all connected NCDAs. Depending on the type of NCDA, the capability to manage all attached energy devices through computer software based commands, or through optional manual override is allowed depending on the specific application. Exemplary embodiments of the present invention contemplate both types of NCDAs, one which allows manual override, and one that does not, depending on the required application. In either case, the result is that energy devices connected to the control devices integrated to the OPEN Network through the NCDA can now be measured for usage, as well as controlled through computer based methods, or through traditional manual control methods if the NCDA is the type that allows manual intervention. This allows energy usage and billing to move to the control device level, a much more granular level than the current facility based meter level.

Energy device Adaptor (EDA). This embodiment contemplates several configuration possibilities, depending on the application required. The EDA can be set up to be connected directly to the CDA either over a wireless network, or over the copper wire, and therefore will simply send/receive its control commands and send measurement data to/from the CDA, which is connected to the OPEN Network. In this case, all measurement and control would be at the CDA level. Alternatively, the EDA can be configured to either control or measure, or do both. The following types of EDAs may be implemented depending on the configuration desired.

EDA: New Energy device Measurement Adaptor (NEDMA). This is an adaptor that is integrated and manufactured directly into the energy device, so as not to require any additional components to be implemented. The NEDMA only measures usage (i.e., does not manage/control) and sends this data to either the CDA or the centralized server over the OPEN Network. This requires special manufacturing of a new type of energy device to replace existing energy devices. Depending on manufacturing costs it is probable that given the limited life of the energy device, this adaptor type would be more expensive given the need to replace these devices periodically.

EDA: Add-on Energy device Measurement Adaptor (AEDMA). This is an adaptor that is a separate component and manufactured as an add-on to existing energy devices or more practically attached to existing housings/sockets in which energy devices are connected to or contained. The benefits of this approach include that it does not require newly manufactured energy devices, and these adaptors can simply be placed in various existing fixtures that house energy devices. Like the NEDMA, the AEDMA only measures usage, and sends this data to either the CDA or the centralized server over the OPEN Network wirelessly or over the copper wire. This requires special manufacturing of the adaptor component itself, and many shapes and sizes are required to fit into the many energy device fixtures in use today. A benefit of this approach is that a long life for the adaptor is retained beyond the limited life of the energy device, which requires periodic replacement.

EDA: New Energy device Control Adaptor (NEDCA). This is an adaptor that is integrated and manufactured directly into the energy device, so as not to require any additional components to be implemented. The NEDCA both measures usage, and manages controls, and sends this data to either the CDA or the centralized server over the OPEN Network. The OPEN network has the ability to send control commands to/from the attached energy device, allowing much more granular control of the device itself for better management. This requires special manufacturing of a new type of energy device to replace existing energy devices. Depending on manufacturing costs it is probable that given the limited life of the energy device, this adaptor type would be more expensive given the need to replace these devices periodically.

EDA: Add-on Energy device Control Adaptor (AEDCA). This is an adaptor that is a separate component and manufactured as an add-on to existing energy devices or, more practically, attached to existing housings/sockets in which energy devices are connected to or contained. Benefits of this approach are that it does not require newly manufactured energy devices, and these adaptors can simply be placed in various existing fixtures that house energy devices. Like the NEDCA, the AEDCA measures usage, and manages controls, and sends receives usage data and commands to/from either the CDA or the centralized server over the OPEN Network wirelessly or over the copper wire. This requires special manufacturing of the adaptor component itself, but many shapes and sizes would be required to fit into the many Energy device fixtures in use today. The benefit of this approach would be a long life for the Adaptor would be retained beyond the limited life of the Energy device, which requires periodic replacement. In an alternate exemplary embodiment, the AEDCA only provides control capability but not measurement capability depending on the application desired.

For ease of description, all of the above will be referred to as EDAs, even though many different combinations of configurations are possible. The EDA enables measurement and/or control to move a level down from the CDA to the energy device. While this obviously provides the lowest level of management and measurement, and would probably maximize efficiency, it may also be more expensive to implement and maintain. The costs of the EDA relative to the resulting benefit will determine the most optimal configuration, and will definitely be application or facility dependent. A separate analysis will determine the most optimal combination of EDA and CDA used to connect to the OPEN Network. Also, any combination of EDA and CDA may be possible in a specific facility.

In summary, at least the following configuration options are possible, or any combination of these options is possible depending on the desired application. An exemplary embodiment of the present invention includes the above adaptor types, but is not limited to these defined types of adaptors to support the concept of alternative control at the device level. Separate CDA and EDA adaptors may be manufactured, or a single adaptor that supports both CDA an EDA may be manufactured.

It is expected that the cost for the adaptor technology may raise the cost of these adaptor ready devices, but that the efficiencies offered by the establishment of the OPEN infrastructure will more than offset the increased costs, and create a very compelling business case which should create adequate incentive for existing buildings to implement the OPEN network, and for all newer construction to implement the OPEN network.

Below are more details surrounding some of the added functions that may be implemented by exemplary embodiments of the adaptors, and by implementing the OPEN network infrastructure using any of the adaptor models described above.

A first primary purpose of the adaptor is to measure or monitor usage and act like a meter at the device level. There are two primary types of measurement: automatic metering, and estimated measurement. Exemplary embodiments offer several methods to accomplish this, including but not limited to the following. First, each device can be registered into the integrated energy management host software on the system with its energy specifications (i.e. watts, amps, etc.), as it is assumed all devices have expected energy usage information that can be used to calculate estimated energy usage using a basic usage formula. The energy management host software fully supports a device inventory in the OPEN network and tracks all types of specifications on each device. This registration can be entered manually into the software when the OPEN infrastructure is first set up, or the adaptor can automatically read the specifications off the device assuming that the device is set up to write/send this data to the adaptor. In the case of NEDMA and NEDCA adaptors, this specification data may automatically be written into the internal adaptor for transmittal to the software when the device is first installed or plugged in. In the case of all add-on adaptors which are external and not built in, this data may need to be manually entered into the OPEN network inventory database (e.g. as device data). For configurations where CDA's are used with no installed EDAs for measurement, the inventory of the devices may need to be manually entered into the specialized software, unless the CDA supports automatic measurement or metering at the control device level for all pre wired energy devices, at which point the CDA adaptor will read and measure all usage for all energy devices connected to that CDA and report this actual and/or estimated usage back to the central server application software. Obviously any time a device is replaced in the OPEN network this device data would need to be updated manually or automatically.

At least two methods of measurement are contemplated. One uses a formula, and can be used to provide reports, and possibly even utility bills at a lower level of detail than the existing and traditional utility metered level to estimate usage by device. In this case, it is possible for the utility company to use this method for billing purposes, assuming that the utility company feels that the estimated formula based method is "plus or minus" enough accuracy and tolerance to be comfortable in issuing the charge on a bill. In the event the utility company does not feel comfortable with this estimated method, the OPEN network can simply provide this information for reference only to the user through the software in addition to the currently provided utility metered summary charge for comparison, auditing, reporting and visibility purposes.

An alternative and more complex method of measuring usage at the device level is for the adaptor to actually have the innate ability to measure device energy usage in a manner consistent with the methods used by the existing meters themselves. Exemplary embodiments cover this capability for all types of adaptors including but not limited to all of the adaptors discussed herein. The economic return on investment (ROI) of this metered approach depends on costs for the adaptors and whether technology advancements in the manner in which meters do this today will be economic enough to be placed at the adaptor level on the OPEN network. Once the OPEN network is capable of measuring actual usage, or at least offer a level of measurement within an acceptable tolerance of the actual usage as measured by the existing meter infrastructure, the current energy billing infrastructure could be replaced by this invention by implementing the OPEN network in each metered facility or building.

Exemplary embodiments can also use a metering component, at the facility level, in a manner that is consistent with the way the utility meter is presently connected, and this meter will use actual facility energy measurement techniques consistent with the manner that the utility meter works. One difference in this additional meter is that it is connected to the OPEN network, and that it reports actual total usage to the software that manages the OPEN network. It communicates to the OPEN network either wirelessly locally, or over the copper network locally to the energy management host software on the host system 104. In this way, the total actual usage is collected automatically on all devices on the OPEN network. This calculated total summary usage can be used to reconcile/compare to the reported aggregated addition of all the devices being managed by the OPEN network that the energy management host software is reporting during implementation and as an audit tool to be sure the details are being monitored appropriately. This meter read can also be compared to the utility meter device for billing reconciliation. In the event that the actual utility meter can be connected to the OPEN network, it may be possible to eliminate this additional meter for this optional facility level reconciliation capability.

Eventually, it may be possible to replace the utility meter, given the fact the OPEN network meter will be automatically and real time fed into the energy management host software system as described above. This has the potential of replacing the entire meter infrastructure as it exists today. In this way, the software system could render an accurate bill, and also the implementation of the OPEN network includes a way to check against actual total energy usage.

Adaptors also offer control and management of each device. This is done by enabling the adaptor to communicate to specialized software (e.g. the energy management host software) and allow electronic communication between the software and the adaptor. The adaptor requires the ability to switch energy devices on and off, possibly control degree of energy for dimming or brightness, and also to allow environmental control information to flow to environment energy devices like heating and air conditioning. Exemplary embodiments are not limited to these uses and can be used to control any type of energy device for any type of purpose.

The adaptors may optionally also allow existing traditional switching or control mechanisms to work in the same way they do today so that manual override can coexist in the OPEN network in the same way that it does today. The OPEN network can therefore act at a layer above and below the existing switching or control capability. It will be possible to create new facilities with only the newer OPEN network, and possibly replace the older methods of switching and thereby reduce costs of existing infrastructure, making up for some or all of the costs of the OPEN infrastructure. It might also be possible to replace all of the switches or control devices in a facility and create an OPEN network that is only at the control device level, or an entire OPEN Network at the Energy device level, or any combination of both. The closer the adaptor gets to the energy device, the more granular the management capability and the greater the benefit, but also the higher the cost to implement OPEN network just due to the sheer number of adaptors required. In summary, OPEN control can be enabled at the control device level, the energy device level, or a combination of both. The capabilities of the automated OPEN network will need to be evaluated on a facility level to determine the most optimal configuration depending on the requirements and expected benefit of each facility.

There are two alternative methods of connecting the adaptor to the computer server. The adaptor will communicate to the central server using one, or a combination of two primary communication methods, the existing copper wire or a newly created or existing wireless network. This will enable an electronic real time connection between each adaptor and the centralized server which contains the energy management host software. The first method described is to use the existing copper wire that is already connecting all of the devices to the existing utility meter and to the utility energy source itself. This copper wire network already exists in the walls of almost any facility, new or existing, and can be leveraged to create the OPEN network. In an exemplary embodiment, standard available protocols over the copper wire are utilized. The second method described would be for each adaptor to enable connection to a wireless network set up to also connect to the computer server. This wireless network would be set up on premise, and would be the backbone of the OPEN network for each facility, and could separate the OPEN network from the copper wire itself. Each method will have certain benefits and potential drawbacks.

The wireless network functions in a manner similar to the copper wire network, by simply creating or forming the OPEN network, connecting all adaptors to the computer server, and enabling bi-directional communication between the energy management software and the adaptor network. Similarly, all OPEN networks can be connected to form a Super OPEN network which would begin to manage energy across multiple utility customers on a common management platform.

There are several implications to adding the software driven automated control function to the EDA. Given that the energy current is not available to power the EDA when the EDA is turned off, several possible solutions exist to enable control at the EDA. Exemplary embodiments of the present invention are not limited to the following alternative solutions discussed, but contemplate any method of providing power to the EDA for turn on when it is coming from the off the position. Also, the same problem does not exist for the usage measurement function at the EDA given the measurement function is only needed when the EDA is actually on and using energy. Also, it may be possible to only enable the control function of turning EDAs off only when they are on, and disabling the on function when the power is not available to the EDA. Here are some alternative solutions that can be made available for the automated turn on function of the EDA.

The EDA has the ability to control the energy device it is attached to. The operation of the EDA is quite simple. It requires power to operate. Exemplary embodiments contemplates that it would run on battery, but that would be more inefficient than using electricity which is directly available. Electricity is always available at the CDA level, but ONLY available at the EDA if the connected controlling CDA is turned on. Therefore, as long as the controlling CDA that this EDA is connected to is set on, the EDA can be live or in production. Being live or in production, means that this energy device is now connected to the OPEN network. Since the OPEN network enables control from a computer server with specialized application software (e.g., the energy management host software), as long as it is on, the control of the energy device can be transferred from the control device or CDA to the EDA. As long as the control device continues to be on, the EDA and its related energy device can be controlled in an automated manner using all of the functionality offered through the OPEN network. When the control device is turned off, the EDA may cease to be connected to the OPEN network because power will be lost. Several possible solutions to this problem may exist, including but not limited to the following. Any combination of capabilities of setting configuration settings in the adaptors through the manual existing control devices (switches, thermostats, etc.) may be used to control variable functions in the adaptors and the software to manage the adaptors would be possible, including not using this function at all.

When the control device is turned off, the EDA may be designed to retain its live orientation for about eight to ten seconds. This is an important capability for the following reasons. Once the EDA is connected to the OPEN network and sits between the CDA/control device and energy device, it can be controlled via the software on the OPEN network. With power on and supplied, the EDA can be overridden by using the manual switch on the control device, acting like computer's mouse click to send commands to the EDA. While the computer software on the OPEN network controls the EDA while the control device is on, the manual switch on the control device can be set up to send control commands to the EDA, so the user can be trained to override the OPEN system control of energy use by using the existing control device manual switching system. Each existing control device switch can be flipped off and then on, up to five times within the eight to ten seconds of the remaining EDA recognition. Each sequence of on and off can be soft coded by the specialized circuit in EDA to manage unique preprogrammed functions from the control device. As an example, the following commands can be set up into the EDA to react to physical user override from the control device itself. This invention includes all possible commands and are not limited to the following example.

Turn off and remain off for eight to ten seconds—Removes each EDA connected to that control device group off the OPEN network until the EDAs are reset back onto the OPEN network through another command.

Turn control device switch on and off twice in rapid succession—Resets EDA onto the OPEN network.

Flip control device switch three times: can be preprogrammed from the OPEN network to be customized commands, or can be set to keep the EDAs off of the OPEN network for a preset period of time, like a full day with preset number of hours.

Flip control device switch four times: another control limit set up through the software.

An exemplary embodiment of the present invention contemplates using the existing control device in place as additional control mechanisms to communicate with the OPEN network, again using existing infrastructure to make the OPEN network a more intelligent energy management environment.

The concept of load balancing to centrally manage demand and supply has both huge economic and conservation benefits worth exploiting. Exemplary embodiments of the present invention enable automated demand response and advanced metering (DRAM) is an existing term and is offered to many utility customers to get cheaper rates effectively for the first time. This is the method of spot pricing energy based on current levels of aggregate demand and supply, enabling a price change based on peak or valley demand periods. If the OPEN network were implemented in a facility, the utility could place the request for demand reduction based on peak period alerts, and the energy management host software would move the OPEN network to an override position which might lower temperature (i.e. 2 degrees or a pre established limit), and cut all lighting to half use, by only activating rooms that are registered for demand reduction during peak times. Obviously certain facility functions/spaces/rooms/employee specific rooms can be set up not to be overridden during a DRAM period due to critical business functions. The added intelligence of the newly created software driven OPEN offers greater flexibility than any other methods in place today. This would save energy, and also provide much lower prices for the facility pushing down costs even more than just reduction and efficiency of usage based on automation. This might also conserve energy greatly at a more macro level, while not compromising identified critical energy requirements, because preset software driven limits and tolerances will be configured through the energy management software to automatically enable a well managed real time DRAM environment which could be remotely or locally controlled.

The computer server (e.g. host system 104) would plug into the copper wire or wireless OPEN network, and each adaptor would have a unique network ID which would be able to be recognized specifically by the computer server for management, and monitoring conditions required to fulfill all of the capabilities of the invention. Technically, each facility itself would carry a unique adaptor ID sequence which theoretically would enable large supplying utilities to control or monitor each OPEN network down to the device level, thereby offering a "Super OPEN network" which may tie multiple facilities together. Today many enterprises are not capable of participating in "Spot Pricing" (DRAM) markets which are now being offered by utilities at lower rates for companies that have the ability to respond to managing energy usage according to more macro energy demand and supply conditions that larger utilities can manage. This invention will enable companies to immediately enter these programs, and also allow utilities the ability to offer control management as an additional service, using a common software platform so certain service level agreements (SLAs) can be set up, managed and monitored striking the balance between conservation, economics, and convenience.

Figure 9:
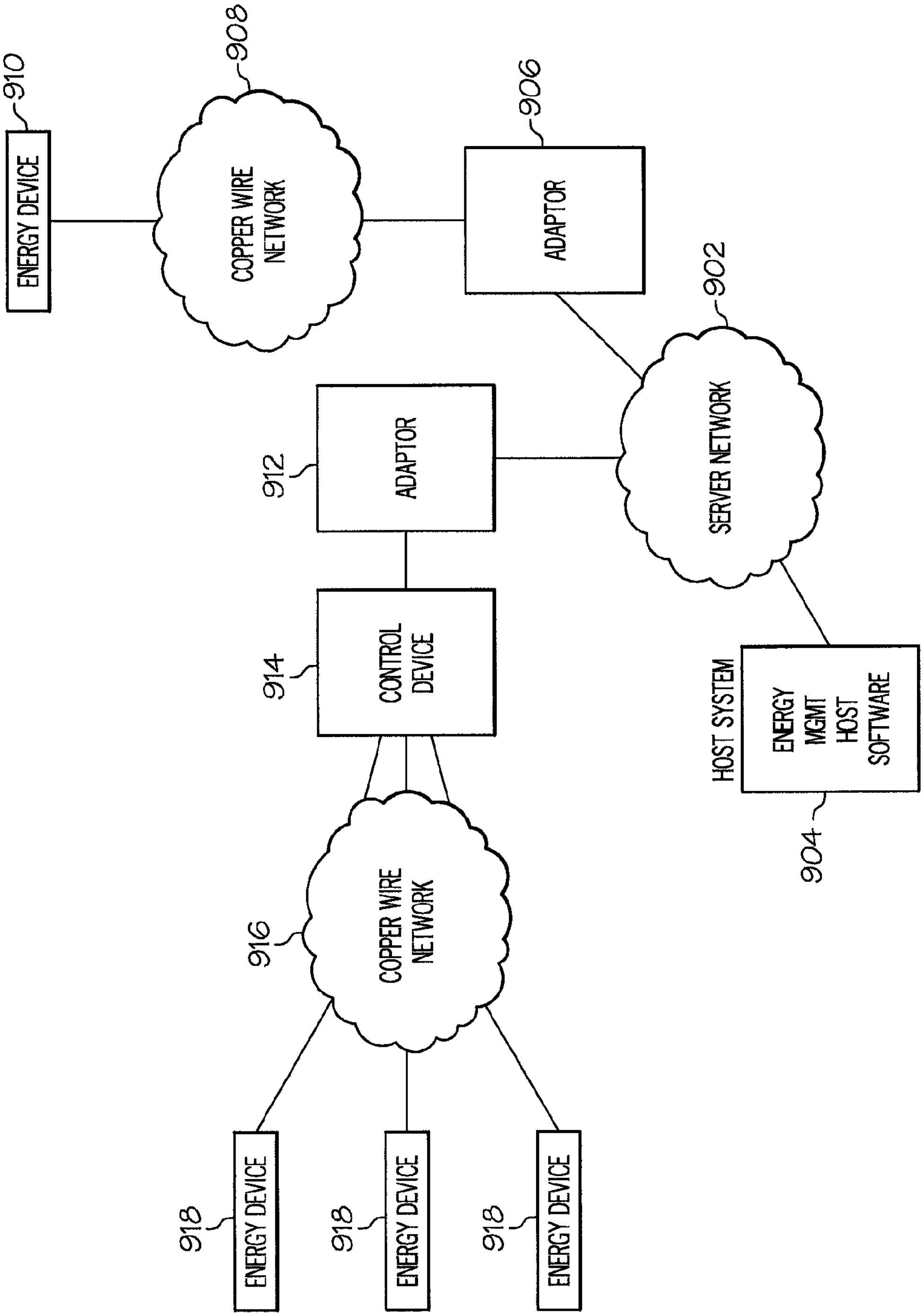
FIG. 9 depicts a block diagram of a system for on-demand energy that may be implemented by exemplary embodiments.

FIG. 9 depicts a block diagram of a system for on-demand energy that may be implemented by exemplary embodiments. FIG. 9 depicts a CDA 912 in communication with a control device 914 (e.g., directly, via a copper wire network, via a wired/wireless network). The control device 914 is in communication with several energy devices 918 via a copper wire network 916. Control commands and energy usage data request commands, from the energy management host software located on a host system 904 are received by the adaptor 912 via the server network 902. FIG. 9 also depicts an EDA 906 that is in communication with an energy device 910 via a copper wire network 908. Again, control commands and energy usage data request commands, from the energy management host software are received by the adaptor 906. Although depicted as two separate networks in FIG. 9, the copper wire networks 908 916 may be a single network.

Figure 10:
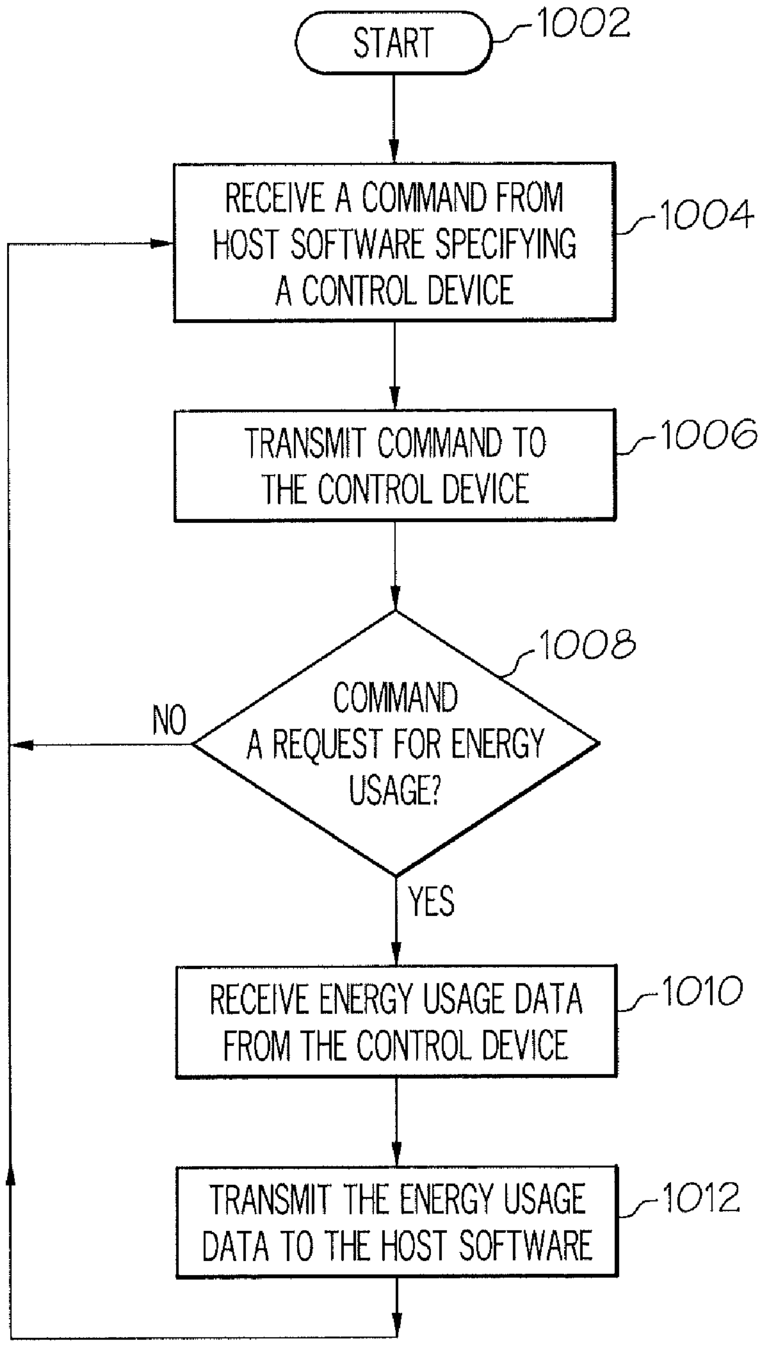
FIG. 10 depicts a process flow that may be implemented by an adaptor in communication with a control device in exemplary embodiments.

FIG. 10 depicts a process flow that may be implemented by an adaptor 912 (e.g., by energy management adaptor software located in the adaptor 912) in communication with a control device 914 in exemplary embodiments. The process begins at block 1002 and proceeds to block 1004 where a command that specifies a control device 914 is received from energy management host software. The command is received via the server network 902. As described previously, the commands may be control commands (e.g., turn on a device(s), set a setting on a device(s), etc.) or they may be a request for energy usage data (e.g., device(s) on/off, temperature setting of the device(s), actual energy used by the device(s) during a specified time period, etc.). The adaptor 912 transmits the command to the specified control device 914. If the command is a control command, the control device 914 performs the command and may or may not return a completion indicator to the adaptor 912, and the processing continues at block 1004. If it is determined, at block 1008, that the command is a request for energy usage data, then block 1010 is performed and energy usage data is returned to the adaptor 912 from the control device 914. In exemplary embodiments, the energy usage data includes information gathered by the control device 914, via the copper wire network 916, for each of the energy devices 918 attached to the control device 914. In an alternate exemplary embodiment, the energy usage data is estimated for each of the energy devices 918 based on a status of the control device 914 and known information about energy usage of the devices 918. At block 1012, the energy usage data is transmitted to the energy management host software on the host system 904. Processing then continues at block 1004 when another command is received at the adaptor 912 from the energy management host software.

Figure 11:
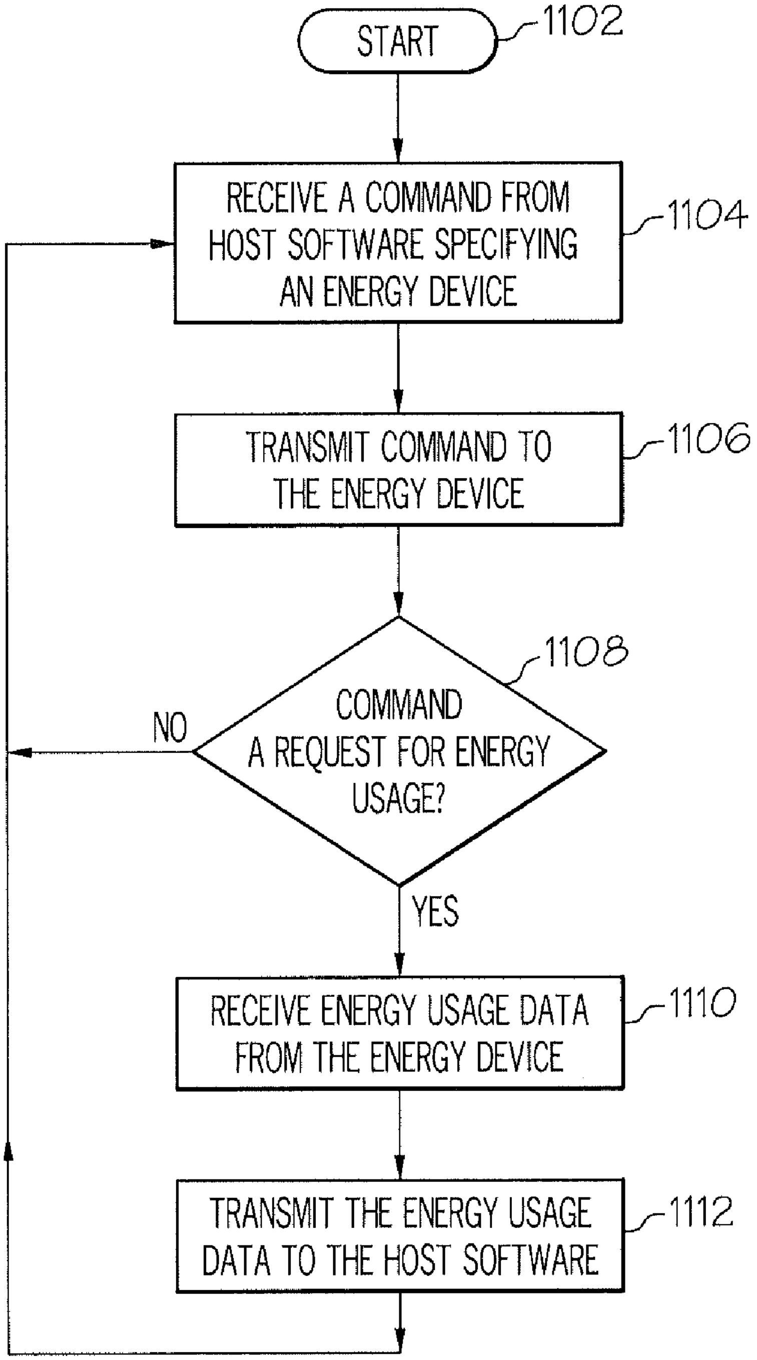
FIG. 11 depicts a process flow that may be implemented by an adaptor in communication with an energy device in exemplary embodiments.

FIG. 11 depicts a process flow that may be implemented by an adaptor 906 (e.g., by energy management adaptor software located in the adaptor 906) in communication with an energy device 910 via a copper wire network 908 in exemplary embodiments. The process begins at block 1102 and proceeds to block 1104 where a command that specifies an energy device 910 is received from energy management host software. The command is received via the server network 902. As described previously, the commands may be control commands (e.g., turn on a device, set a setting on a device, etc.) or they may be a request for energy usage data (e.g., device on/off, temperature setting of the device, actual energy used by the device during a specified time period, etc.). The adaptor 906 transmits the command to the energy device 910. If the command is a control command, the energy device 910 performs the command and may or may not return a completion indicator to the adaptor 906, the processing continues at block 1004. If it is determined, at block 1108, that the command is a request for energy usage data, then block 1110 is performed and energy usage data is returned to the adaptor 906 from the energy device 910. In exemplary embodiments, the energy usage data includes information gathered from the energy device 910. In an alternate exemplary embodiment, the energy usage data is estimated for the energy device 910 based on a status of the energy device 910 and known information about energy usage of the energy device 910. At block 1112, the energy usage data is transmitted to the energy management host software on the host system 904. Processing then continues at block 1104 when another command is received at the adaptor 912 from the energy management host software.

Figure 12:
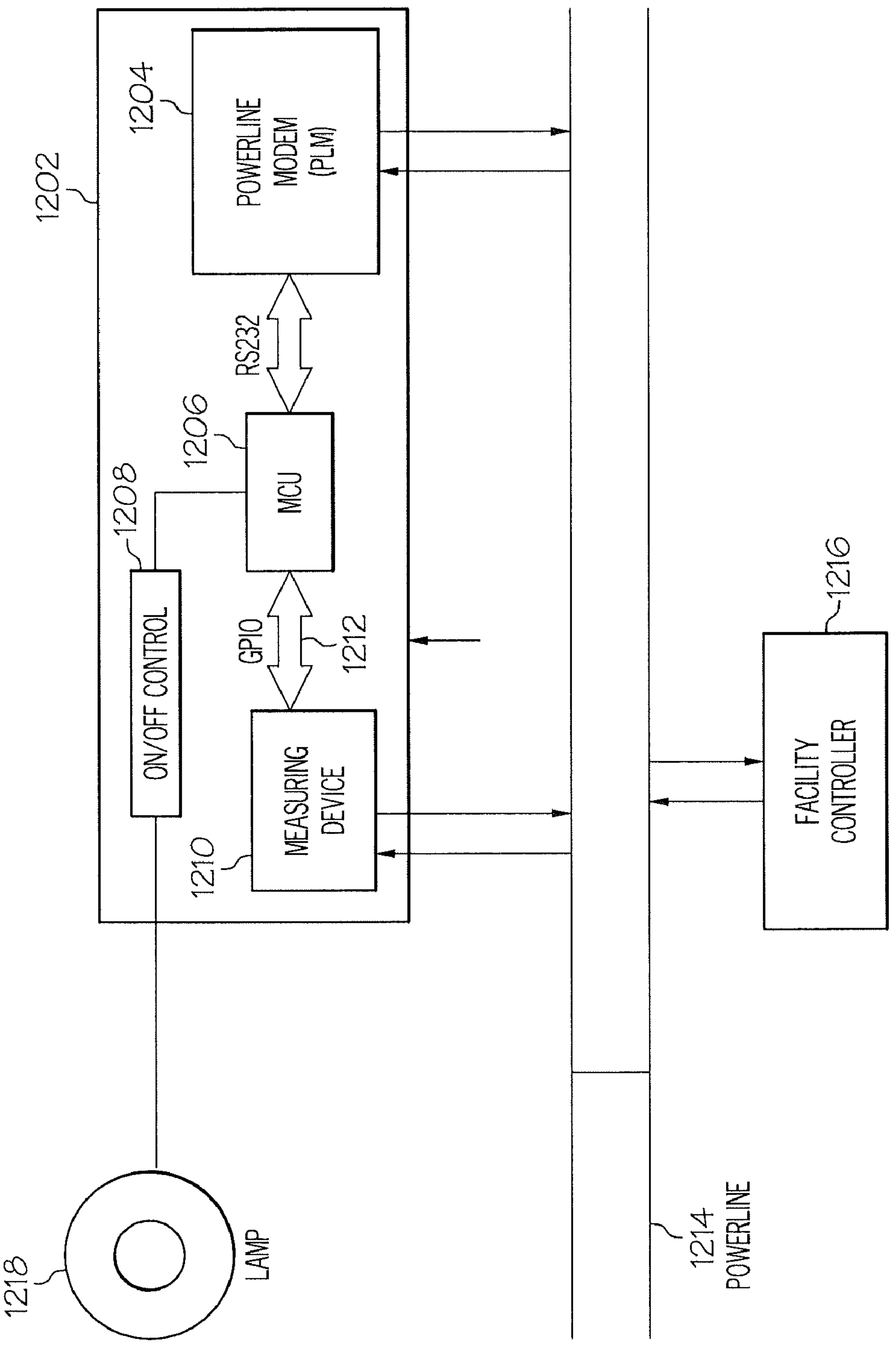
FIG. 12 depicts an adaptor that may be implemented by exemplary embodiments.

FIG. 12 depicts an adaptor 1202 that may be implemented by exemplary embodiments. The adaptor 1202 depicted in FIG. 12 includes a power line modem (PLM) 1204, a microcontroller unit (MCU) 1206, a general purpose input/output (GPIO) 1212, a measuring device 1210 and an on/off control signal device 1208. The adaptor 1202 depicted in FIG. 12 is connected to an individual energy device 1218 via a copper wire and to a facility controller 1216 via a power line 1214. The facility controller 1216 is connected to the energy management host software 104 as well as to the energy management adaptor software 202 located in the MCU 1206. In an exemplary embodiment, processing is shared by the facility controller 1216 and one or both of the host system and the adaptor.

In an exemplary embodiment, functions performed by the adaptor 1202 include: interfacing to the facility controller 1216; sampling the voltage and current using the measuring device 1210 every second (or some other selected interval); processing messages from the facility controller 1216 to control the device 1206; processing messages from the facility controller 1216 to receive requests for providing usage information about the device 1206; sending usage information to the facility controller 1216 and storing usage data in local memory on the MCU 1206. In an exemplary embodiment, these functions are facilitated by the energy management adaptor software 202 located in the MCU 1206 on the adaptor 1202.

In an exemplary embodiment, facility controllers 1216 are installed at facilities using the energy management software. In exemplary embodiments, the facility controller 1216 is a computer processor executing portions or all of the energy management host software. The facility controller 1216 is connected to the adaptor 1202 via the PLM 1204. The facility controller 1216 manages the facility's adaptors 1202 including powering them on/off, dimming them, measuring their power consumption and querying for their status.

In an exemplary embodiment, the PLM 1204 is implemented any PLM known in the art such as an INSTEON-to-serial bridge module that plugs into a power outlet and also has a serial port connected to a personal computer.

The adaptor 1202 depicted in FIG. 12 is connected to the power line 1214 on one end and to an individual energy device 1218 on the other end. The adaptor 1202 collects periodic usage statistics and store the usage data. In an exemplary embodiment, the adaptor 1202 is queried for usage information (e.g., via a an INSTEON protocol or some other protocol). The request for usage data can be for the last hour, or the last several hours, or some other time frame. Signals from the on/off signal device 1208 cause the attached device 1206 to be turned on, turned off, dimmed, etc.

In an exemplary embodiment, the on/off signal device 1208 turns the device 1218 on or off. In the embodiment depicted in FIG. 12, the MCU 1206 controls the on/off switch of the device 1218 via the GPIO 1212.

Figure 13:
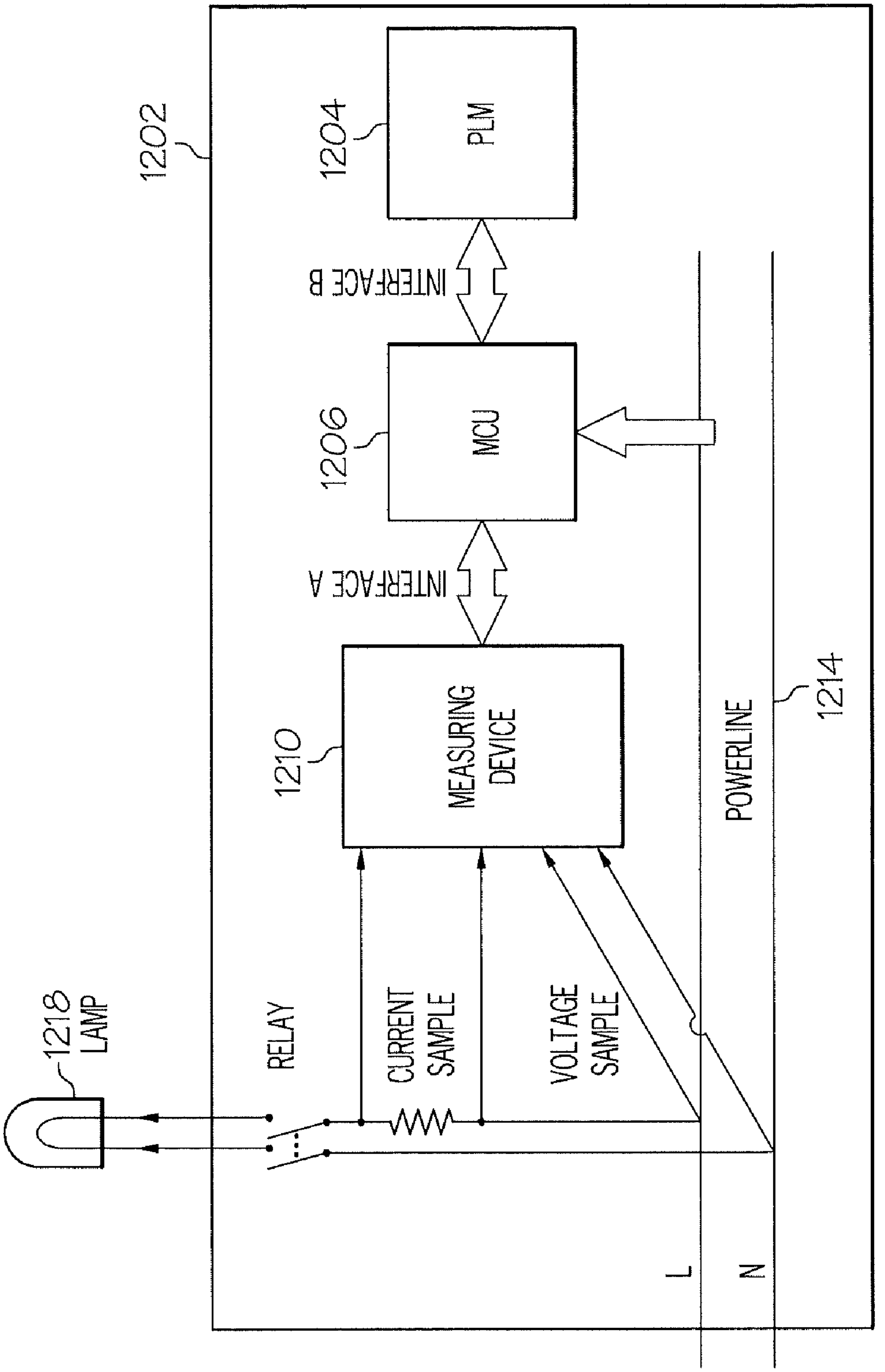
FIG. 13 depicts exemplary connections in an adaptor for measuring power usage.

FIG. 13 depicts exemplary connections that may be present in the adaptor 1202 for measuring power usage at the device 1218. As depicted in FIG. 13, the power measuring device 1210 calculates the power usage of the device 1218 by sampling the voltage and the current. The output is a pulse signal, and the frequency of the pulse indicates the usage.

Figure 14:
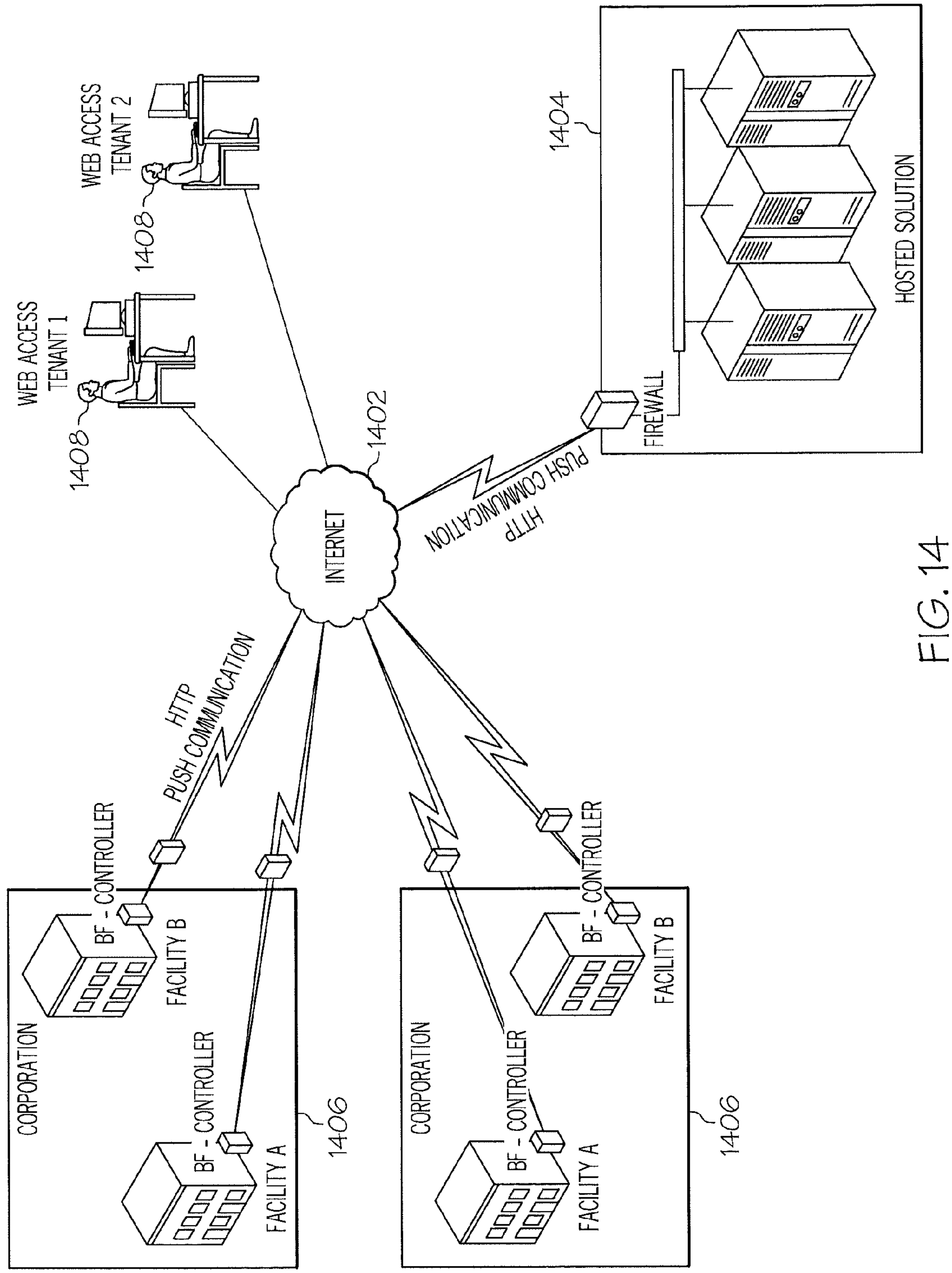
FIG. 14 depicts a block diagram of a network for providing on-demand energy management that may be implemented by exemplary embodiments.

FIG. 14 depicts a block diagram of a network for providing on-demand energy management that may be implemented by exemplary embodiments. FIG. 14 depicts a plurality of corporations 1406 each having a plurality of facilities. Each of the facilities are in communication with the energy management host software located on the host system 1404 via a network 1402. In addition, FIG. 14 depicts a plurality of user systems 1408 for accessing the energy management host software. As depicted in FIG. 14, each facility where the adaptors are installed includes a facility controller for managing the facility power (e.g., on/off, dim, metering, statistics, and statuses). The facility controller acts as a hub to communicate with the energy management host software located on the host system 1404 and the controlled facility. It receives commands from the energy management host software located on the host system 1404 and forwards them to the energy management adaptor software. In addition, the facility controller sends events and statistics data to the software located on the host system 1404. Thus, the facility controller acts as a bridge between the energy management host software and the energy management adaptor software. In an exemplary embodiment, the energy management host software is utilized to manage tenants, and to perform building configuration, monitoring, controlling and analysis. In an exemplary embodiment, the controller communicates with the energy management host software using a HTTP protocol with data being transferred using a push technology.

In exemplary embodiments, the facility controllers are responsible for executing different scheduling and power management tasks for their corresponding facility. In addition, the facility controllers send statistics to the energy management host software. In exemplary embodiments, the facility controller also executes control commands on the power line (e.g., a user logs on and wants to control devices at the facility directly, in this case the commands are sent to the facility controller that in turn translates them into power line commands and executes them). The facility controller may also discover new devices installed in the network and provide configurations of the discovered devices to the energy management host software.

In exemplary embodiments of the adaptor, software and/or hardware relating to communications with the server network/facility controller are referred to as the server network interface, software and/or hardware relating to communications with a control device are referred to as the control device interface, and software and/or hardware relating to communications with an energy device are referred to as the energy device interface. In exemplary embodiments the software located at the adaptor to perform these functions is included in the energy management adaptor software.

As described herein, commands may include control instructions. Control instructions may include instructions such as, but not limited to: turn device on, turn device off, adjusting a setting on a device (e.g., a temperature setting), and setting a state of the device (e.g., in the case of a traffic light, turn light red, yellow, or green).

As used herein, the term facility may also be utilized to refer to a specific geographic area. For example, a facility may correspond to a geographic location such as, but not limited to a stretch of roadway, with exemplary embodiments being utilized to manage lights on highways. Stoplights may be managed based on actual traffic patterns using electrical eyes to determine the actual traffic patterns. In addition, an entire town can manage its electrical network of outdoor energy utilizing the adaptors and software described herein.

As described above, the embodiments of the invention may be embodied in the form of hardware, software, firmware, or any processes and/or apparatuses for practicing the embodiments. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. An adaptor for providing computer based energy management, the adaptor comprising:

a server network interface in communication with energy management host software via a server network, the server network interface receiving commands from the energy management host software, the commands specifying a control device and including control instructions and requests for energy usage data; and a control device interface in communication with the specified control device, the control device interface transmitting the commands to the control device and receiving energy usage data from the control device in response to a command including a request for energy usage data, the energy usage data including energy usage for one or more energy devices in communication with the control device via a copper wire network, the server network interface transmitting the energy usage data to the energy management software in response to receiving the energy usage data from the control device, the adaptor including a unique network identifier, the unique network identifier addressable by the energy management host software, the adapter providing a bridge between the server network and the copper wire network to provide control and measurement of energy usage at a control device level in response to commands from a remote computer system.

2. The adaptor of claim 1 wherein the control device interface is in communication with the control device via the copper wire network.

3. The adaptor of claim 1 wherein the one or more energy devices, the control device, and the adaptor are located at a commercial enterprise.

4. The adaptor of claim 1 wherein the adaptor is integrated into the control device.

5. The adaptor of claim 1 wherein the energy usage data includes one or more of on/off status of the one or more energy devices, and energy units utilized by the one or more energy devices.

6. The adaptor of claim 5 wherein the energy units utilized by the one or more energy devices are estimated by the adaptor or the energy management host software based on an amount of time that the one or more energy devices have been in an on status.

7. The adaptor of claim 1 wherein the energy usage data is measured over a time interval.

8. The adaptor of claim 1 wherein the control instruction includes one or more of turning on the one or more energy devices and turning off the one or more energy devices.

9. The adaptor of claim 1 wherein the control instruction includes adjusting a setting or setting a state on the one or more energy devices.

10. An adaptor for providing computer based energy management, the adaptor comprising:

a server network interface in communication with energy management host software via a server network, the server network interface receiving commands from the energy management host software, the commands specifying an energy device and including control instructions and requests for energy usage data; and an energy device interface in communication with the specified energy device via a copper wire network, the energy device interface transmitting the commands to the energy device and receiving energy usage data from the energy device in response to a command including a request for energy usage data, the server network interface transmitting the energy usage data to the energy management software in response to receiving the energy usage data from the control device, and the adaptor including a unique network identifier, the unique network identifier addressable by the energy management host software, the adapter providing a bridge between the server network and the copper wire network to provide control and measurement of energy usage at an energy device level in response to commands from a remote system.

11. The adaptor of claim 10 wherein the server network interface is in communication with the energy management software via the copper wire network.

12. The adaptor of claim 10 wherein the energy device, the control device, and the adaptor are located at a commercial enterprise.

13. The adaptor of claim 10 where the energy device, the control device, and the adaptor are located at a town facility, a municipal facility, or an outdoor energy infrastructure.

14. The adaptor of claim 10 wherein the adaptor is integrated into the energy device.

15. The adaptor of claim 10 wherein the energy usage data includes one or more of on/off status of the energy device, and energy units utilized by the energy device.

16. The adaptor of claim 15 wherein the energy units utilized by the energy device are estimated by the adaptor or the energy management host software based on an amount of time that the energy device has been in an on status.

17. The adaptor of claim 10 wherein the energy usage data is measured over a time interval.

18. The adaptor of claim 10 wherein the control instruction includes one or more of turning on the energy device and turning off the energy device.

19. The adaptor of claim 10 wherein the control instruction includes adjusting a setting or setting a state on the energy device.

20. A method for providing computer based energy management, the method comprising:

receiving commands specifying a control device from energy management host software located on a host system, the receiving at an adaptor via a server network, the adapter including a unique network identifier, the unique network identifier addressable by the energy management host software, and the commands including control instructions and requests for energy usage data;

transmitting the commands to the control device via a control device interface on the adaptor;

receiving energy usage data from the control device in response to a command including a request for energy usage, the energy usage data including energy usage for one or more energy devices in communication with the control device via a copper wire network;

transmitting the energy usage data to the energy management software in response to receiving the energy usage data from the control device, thereby providing a bridge between the server network and the copper wire network to provide control and measurement of energy usage at a control device level in response to commands received from the energy management host software.

21. A method for providing computer based energy management, the method comprising:

receiving commands specifying an energy device from energy management host software located on a host system, the receiving at an adaptor via a server network, the adapter including a unique network identifier, the unique network identifier addressable by the energy management host software, and the commands including control instructions and requests for energy usage data;

transmitting the commands to the energy device via an energy device interface on the adaptor, the energy device interface in communication with the energy device via a copper wire network;

receiving energy usage data from the energy device in response to a command including a request for energy usage, the energy usage data including energy usage for the energy device;

transmitting the energy usage data to the energy management software in response to receiving the energy usage data from the control device, thereby providing a bridge between the server network and the copper wire network to provide control and measurement of energy usage at an energy device in response to commands received from the energy management host software.

22. An adaptor for providing computer based energy management, the adaptor comprising:

a server network interface in communication with energy management host software via a server network, the server network interface receiving commands from the energy management host software, the commands specifying a control device or an energy device and including requests for energy usage data; and a device interface in communication with the specified device, the device interface transmitting the commands to the specified device and receiving energy usage data from the specified device in response to the commands, the energy usage data including energy usage for the device if the device is an energy device, the energy device in communication with the device interface via a copper wire network, and the energy usage data including energy usage for one or more energy devices in communication with the specified device via a copper wire network if the specified device is a control device, the server network interface transmitting the energy usage data to the energy management software in response to receiving the energy usage data from the specified device, the adaptor including a unique network identifier, the unique network identifier addressable by the energy management host software, the adapter thereby providing a bridge between the server network and the copper wire network to provide control and measurement of energy usage at a device level in response to commands from a remote computer system.

* * * * *